US012581672B2

(12) United States Patent
Yoshimura

(10) Patent No.: US 12,581,672 B2
(45) Date of Patent: Mar. 17, 2026

(54) SEMICONDUCTOR DEVICE

(71) Applicant: ROHM CO., LTD., Kyoto (JP)

(72) Inventor: Kenichi Yoshimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 350 days.

(21) Appl. No.: 18/253,074

(22) PCT Filed: Oct. 21, 2021

(86) PCT No.: PCT/JP2021/038943
§ 371 (c)(1),
(2) Date: May 16, 2023

(87) PCT Pub. No.: WO2022/137767
PCT Pub. Date: Jun. 30, 2022

(65) Prior Publication Data
US 2023/0420446 A1 Dec. 28, 2023

(30) Foreign Application Priority Data

Dec. 24, 2020 (JP) ................................ 2020-215445

(51) Int. Cl.
*H10D 89/60* (2025.01)
*H10D 8/00* (2025.01)
(52) U.S. Cl.
CPC ............. *H10D 8/411* (2025.01); *H10D 89/60* (2025.01); *H10D 89/611* (2025.01)
(58) Field of Classification Search
CPC . H10D 8/00; H10D 8/20; H10D 8/411; H10D 8/422; H10D 89/60; H10D 89/611; H10D 89/921; H10D 89/931
See application file for complete search history.

(56) References Cited

U.S. PATENT DOCUMENTS 6,590,264 B2 * 7/2003 Ker ...................... H10D 89/611
257/355
7,012,304 B1 * 3/2006 Dabral ................. H10D 89/611
257/357

(Continued)

FOREIGN PATENT DOCUMENTS

| JP | H07169980 A | 7/1995 |
| JP | 2012-049444 A | 3/2012 |

(Continued)

OTHER PUBLICATIONS

Notice of Reasons for Refusal issued in connection with corresponding Japanese patent application No. 2022-571906 dated Jul. 3, 2025.

(Continued)

*Primary Examiner* — Eduardo A Rodela
(74) *Attorney, Agent, or Firm* — RABIN & BERDO, P.C.

(57) ABSTRACT

A semiconductor device includes a semiconductor layer having a principal surface, a first-conductivity-type well region formed at a surface layer portion of the principal surface of the semiconductor layer, a first-conductivity-type first impurity region that is formed at a surface layer portion of the well region and that has an inner wall portion, and a second-conductivity-type annular second impurity region formed at the surface layer portion of the well region on a more inward side than the inner wall portion such that a pn junction portion is formed between the well region and the second impurity region.

13 Claims, 21 Drawing Sheets

(56)                    References Cited

U.S. PATENT DOCUMENTS

|  |  |  |  |
|---|---|---|---|
| 8,143,690 B2* | 3/2012 | Park ..................... | H10D 84/221 |
|  |  |  | 257/E27.024 |
| 9,559,170 B2* | 1/2017 | Stribley ............... | H10D 62/108 |
| 10,157,903 B2* | 12/2018 | Higashi ................... | H10D 89/60 |
| 11,302,686 B2* | 4/2022 | Chen ...................... | H10D 89/60 |
| 11,742,342 B2* | 8/2023 | Kim ..................... | H10D 89/611 |
|  |  |  | 257/546 |
| 2007/0278614 A1 | 12/2007 | Collins et al. |  |
| 2009/0261418 A1 | 10/2009 | Yajima |  |
| 2013/0020673 A1 | 1/2013 | Hirama |  |
| 2018/0294364 A1* | 10/2018 | Pak ..................... | H10D 62/106 |

FOREIGN PATENT DOCUMENTS

|  |  |  |  |
|---|---|---|---|
| JP | 2013-026384 A | 2/2013 |
| JP | 2017-073594 A | 4/2017 |

OTHER PUBLICATIONS

German Office Action dated Oct. 10, 2023, in the counterpart German Patent Application No. 112021006106.2.
Office Action issued for corresponding Japanese patent application No. 2022-571906 on Nov. 13, 2025.
International Search Report for PCT/JP2021/038943, mailed on Dec. 28, 2021.
Written Opinion of the International Searching Authority for PCT/JP2021/038943, mailed on Dec. 28, 2021.

* cited by examiner

FIG. 14

SEMICONDUCTOR DEVICE

TECHNICAL FIELD

The present invention relates to a semiconductor device.

BACKGROUND ART

Patent Literature 1 mentioned below discloses a protection circuit having a diode that protects circuit elements, such as a transistor or a capacitor forming an integrated circuit (IC), from an electrostatic discharge (ESD).

CITATION LIST

Patent Literature

Patent Literature 1: Japanese Patent Application Publication No. 2017-73594

SUMMARY OF INVENTION

Technical Problem

A diode used in a protection circuit is required to reduce an electrostatic capacity. Therefore, a possible way for reducing the electrostatic capacity is to downsize the diode, and yet, if so, there is a concern that ESD resistance properties will decrease.

Therefore, an object of the present invention is to provide a semiconductor device that is capable of reducing an electrostatic capacity and that is capable of restraining a decrease in ESD tolerance.

Solution to Problem

A semiconductor device of this disclosure includes a semiconductor layer having a principal surface, a first-conductivity-type well region formed at a surface layer portion of the principal surface of the semiconductor layer, a first-conductivity-type first impurity region that is formed at a surface layer portion of the well region and that has an inner wall portion, and a second-conductivity-type annular second impurity region formed at the surface layer portion of the well region on a more inward side than the inner wall portion such that a pn junction portion is formed between the well region and the second impurity region.

With this arrangement, the well region and the second impurity region form a pn junction portion, and therefore electric charge is accumulated near an interface between the second impurity region and the well region. With the aforementioned arrangement, the second impurity region is annular. Therefore, it is possible to make the area of the interface between the second impurity region and the well region smaller when compared to an arrangement in which the shape of the second impurity region is, for example, circular, not annular, in a plan view unlike the aforementioned arrangement. Therefore, it is possible to reduce an electrostatic capacity.

The ESD current is predominant in a part, which is close to the first impurity region, of the second impurity region. In detail, a contribution to an ESD current capability of a part, which is far from the first impurity region, of the second impurity region is much smaller than a contribution to an ESD current capability of the part, which is close to the first impurity region, of the second impurity region.

Therefore, if the second impurity region is annular, it is possible to secure an ESD current capability equivalent to an arrangement in which the shape of the second impurity region in a plan view is a circular shape. Therefore, it is possible to restrain a decrease in ESD current capability. In other words, it is possible to restrain a decrease in ESD resistance properties.

As thus described, it is possible to restrain a decrease in ESD tolerance and to reduce the electrostatic capacity if the second impurity region is annular.

The aforementioned or still other objects, features, and effects of the present invention will be clarified by the following description of preferred embodiments with reference to the accompanying drawings.

BRIEF DESCRIPTION OF DRAWINGS

FIG. 14 is a plan view of a diode of a third modification.

DESCRIPTION OF EMBODIMENTS

Figure 1:
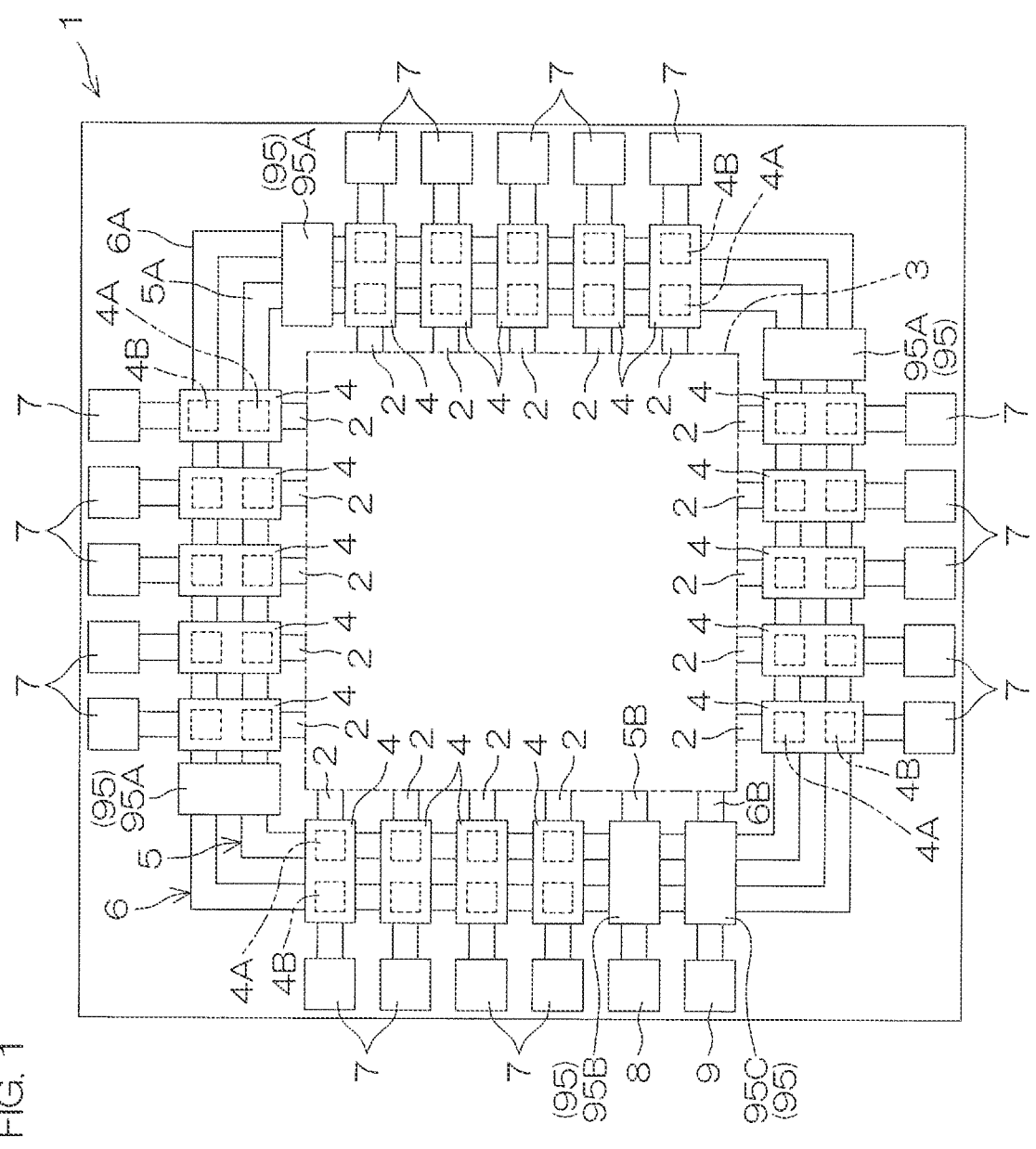
FIG. 1 is a plan view of a semiconductor device according to a preferred embodiment of the present invention.

FIG. 1 is a plan view of an IC chip 1 serving as a semiconductor device according to a preferred embodiment of the present invention. The IC chip 1 has a substantially cubic shape. The IC chip 1 includes a plurality of input-output wiring lines 2 into which a signal is input from the outside or from which a signal is output to the outside, an internal circuit 3 that is electrically connected to the input-output wiring lines 2 and that serves as a to-be-protected element, and a plurality of protection elements 4 that protect the internal circuit 3 from overvoltage based on, for example, ESD. The protection element 4 is an element, chiefly, used to protect the internal circuit 3 from ESD that is input into the input-output wiring line 2 in this preferred embodiment, and therefore the protection element 4 may be referred to as, for example, an ESD protection element.

The IC chip 1 additionally includes a first power wiring line 5 to which a first power-supply voltage (for example, 5 V) is applied, a second power wiring line 6 to which a second power-supply voltage (for example, reference voltage) is applied, and a plurality of pads that are connected to the wiring lines (the input-output wiring lines 2, the first power wiring line 5, and the second power wiring line 6), respectively.

For descriptive convenience, the input-output wiring line 2, the first power wiring line 5, and the second power wiring line 6 are each shown by a solid line in FIG. 1, and yet this does not mean that these members appear on a surface of the IC chip 1.

The pads include a plurality of input-output pads 7 electrically connected to the input-output wiring lines 2, respectively, a first power pad 8 electrically connected to the first power wiring line 5, and a second power pad 9 electrically connected to the second power wiring line 6. A connection member (not shown), such as a bonding wire, is connected to each of the pads (each of the input-output pads 7, the first power pad 8, and the second power pad 9).

The first power wiring line 5 includes a first annular power wiring line 5A that extends in a substantially annular shape such that the first annular power wiring line 5A surrounds the internal circuit 3 and a first connection wiring line 5B that is electrically connected to the first annular power wiring line 5A, to the first power pad 8, and to the internal circuit 3 in a plan view.

The second power wiring line 6 includes a second annular power wiring line 6A that extends in a substantially annular shape such that the second annular power wiring line 6A surrounds the internal circuit 3 outside the first power wiring line 5 and a second connection wiring line 6B that is electrically connected to the second annular power wiring line 6A, to the second power pad 9, and to the internal circuit 3 in a plan view.

Each of the protection elements 4 is disposed at a position coinciding with the first annular power wiring line 5A of the first power wiring line 5 and with the second annular power wiring line 6A of the second power wiring line 6 in a plan view. Each of the protection elements 4 includes a plurality of first protection elements 4A that are electrically connected to the first power wiring line 5 and to the input-output wiring line 2 and a second protection element 4B that is electrically connected to the second power wiring line 6 and to the input-output wiring line 2. In each of the protection elements 4, the first protection element 4A is disposed at a position coinciding with the first annular power wiring line 5A of the first power wiring line 5 in a plan view, and the second protection element 4B is disposed at a position coinciding with the second annular power wiring line 6A of the second power wiring line 6 in a plan view.

The IC chip 1 additionally includes a large-capacity protection element 95 that has an electrostatic capacity larger than the protection element 4. The large-capacity protection element 95 is composed of, for example, a NMOS (Negative-channel Metal Oxide Semiconductor) type transistor and a diode.

In this preferred embodiment, the large-capacity protection element 95 is provided as a plurality of large-capacity protection elements. The large-capacity protection elements 95 are disposed at positions coinciding with the first annular power wiring line 5A of the first power wiring line 5 and the second annular power wiring line 6A of the second power wiring line 6, respectively, in a plan view. The large-capacity protection elements 95 include a plurality of first large-capacity protection elements 95A disposed at positions not coinciding with the first connection wiring line 5B and the second connection wiring line 6B, respectively, in a plan view, a second large-capacity protection element 95B disposed at a position coinciding with the first connection wiring line 5B of the first power wiring line 5 in a plan view, and a third large-capacity protection element 95C disposed at a position coinciding with the second connection wiring line 6B of the second power wiring line 6 in a plan view.

Figure 2:
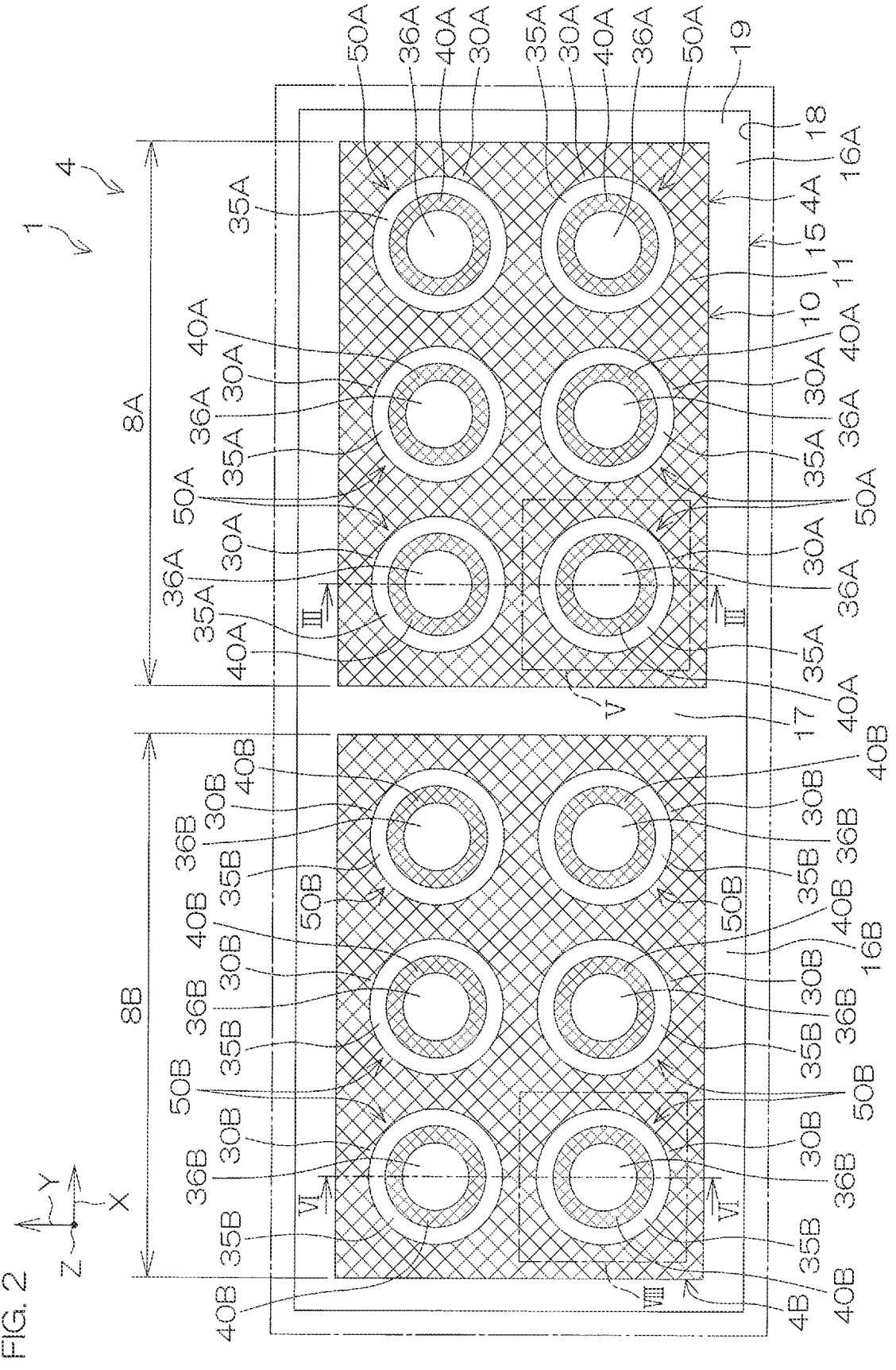
FIG. 2 is a plan view of a protection element included in the semiconductor device and of an area surrounding the protection element.

FIG. 2 is a plan view of the protection element 4 and of an area surrounding the protection element 4.

In FIG. 2, a first contact electrode 67A, a second contact electrode 72A, a third contact electrode 67B, a fourth contact electrode 72B, a first connection structure 65A, a second connection structure 70A, a third connection structure 65B, a fourth connection structure 70B, a first interlayer insulating film 60A, and a second interlayer insulating film 60B, which are described later, are removed.

The protection element 4 has a semiconductor layer 10 and a region defining structure 15 that defines a first active region 8A in which the first protection element 4A is formed and a second active region 8B in which the second protection element 4B is formed.

The semiconductor layer 10 is made of, for example, an Si monocrystal. The semiconductor layer 10 has a first principal surface 11 on one side and a second principal surface 12 on the other side (see FIG. 3 and FIG. 6 described later).

The region defining structure 15 includes a first element separation portion 16A that has an endless shape in a plan view and that surrounds the first active region 8A and a second element separation portion 16B that has an endless shape in a plan view and that surrounds the second active region 8B. In the present preferred embodiment, the first element separation portion 16A and the second element separation portion 16B are each formed in a quadrangular annular shape in a plan view seen from the normal direction Z of the first and second principal surfaces 11 and 12 (also see FIG. 3) (hereinafter, referred to simply as a "plan view"). The first active region 8A and the second active region 8B are each defined in a quadrangular shape by means of the region defining structure 15 in a plan view.

The first element separation portion 16A and the second element separation portion 16B of the region defining structure 15 are integrally formed between the first active region 8A and the second active region 8B in an example shown in FIG. 2. The thus integrally formed first element separation portion 16A and second element separation portion 16B are formed as a separation portion 17 that separates the first active region 8A and the second active region 8B from each other.

In a case in which the first element separation portion 16A and the second element separation portion 16B are formed with an interval therebetween unlike the example of FIG. 1, the separation portion 17 of the region defining structure 15 consists of the first element separation portion 16A and the second element separation portion 16B that face each other across a region of a part of the semiconductor layer 10.

A direction in which a side of the first element separation portion 16A extends in a plan view is defined as a first direction X. A direction perpendicular to both the first direction X and the normal direction Z is defined as a second direction Y. In this preferred embodiment, the first active region 8A and the second active region 8B face each other with respect to the first direction X.

The region defining structure 15 includes a trench 18 formed by digging the first principal surface 11 down toward the second principal surface 12 and an insulating embedded object 19 embedded in the trench 18. An insulator forming the insulating embedded object 19 is optional. The insulating embedded object 19 may include at least one of silicon oxide ($SiO_2$) and silicon nitride (SiN). In this preferred embodiment, the insulating embedded object 19 is made of silicon oxide.

Figure 3:
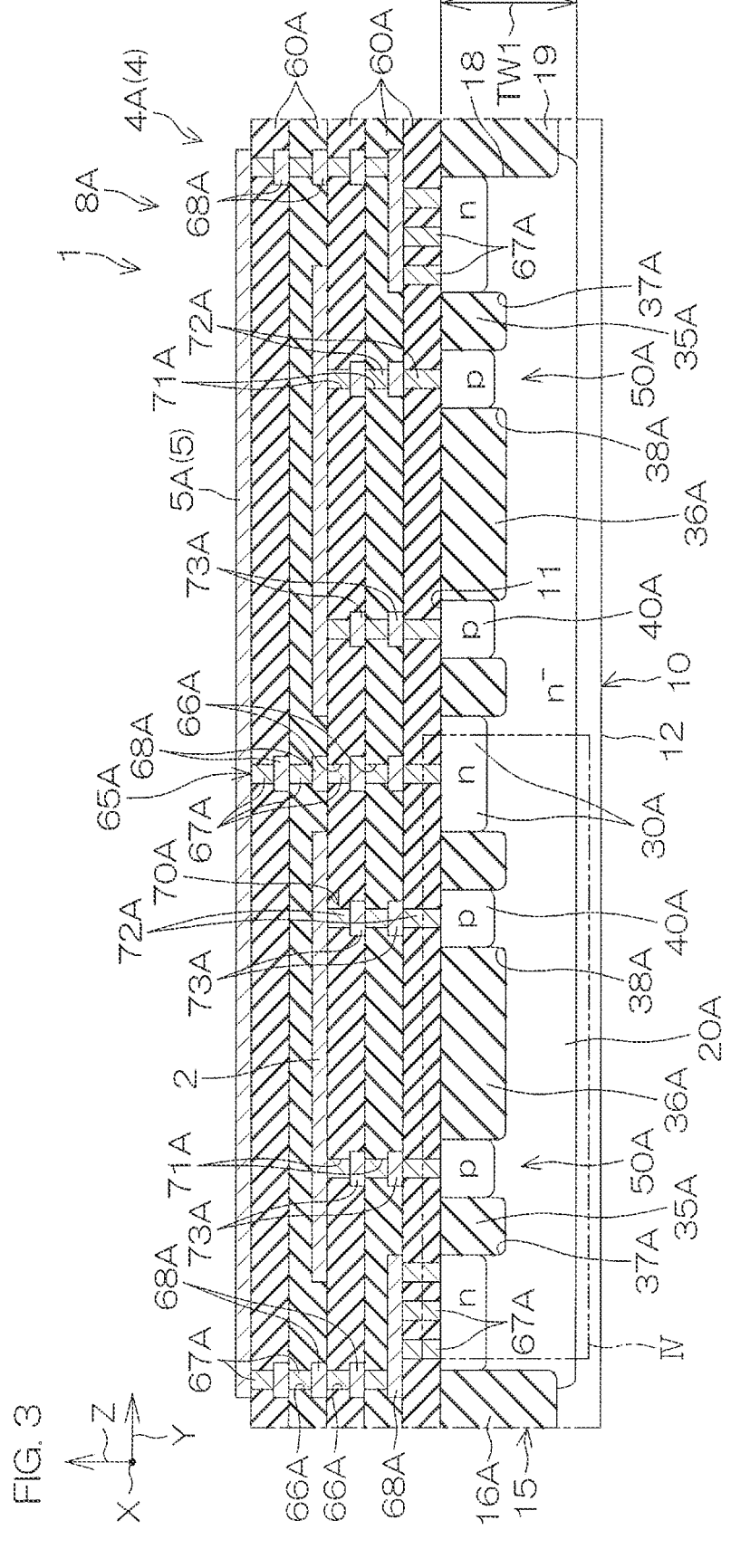
FIG. 3 is a cross-sectional view taken along line III-III shown in FIG. 2.
Figure 4:
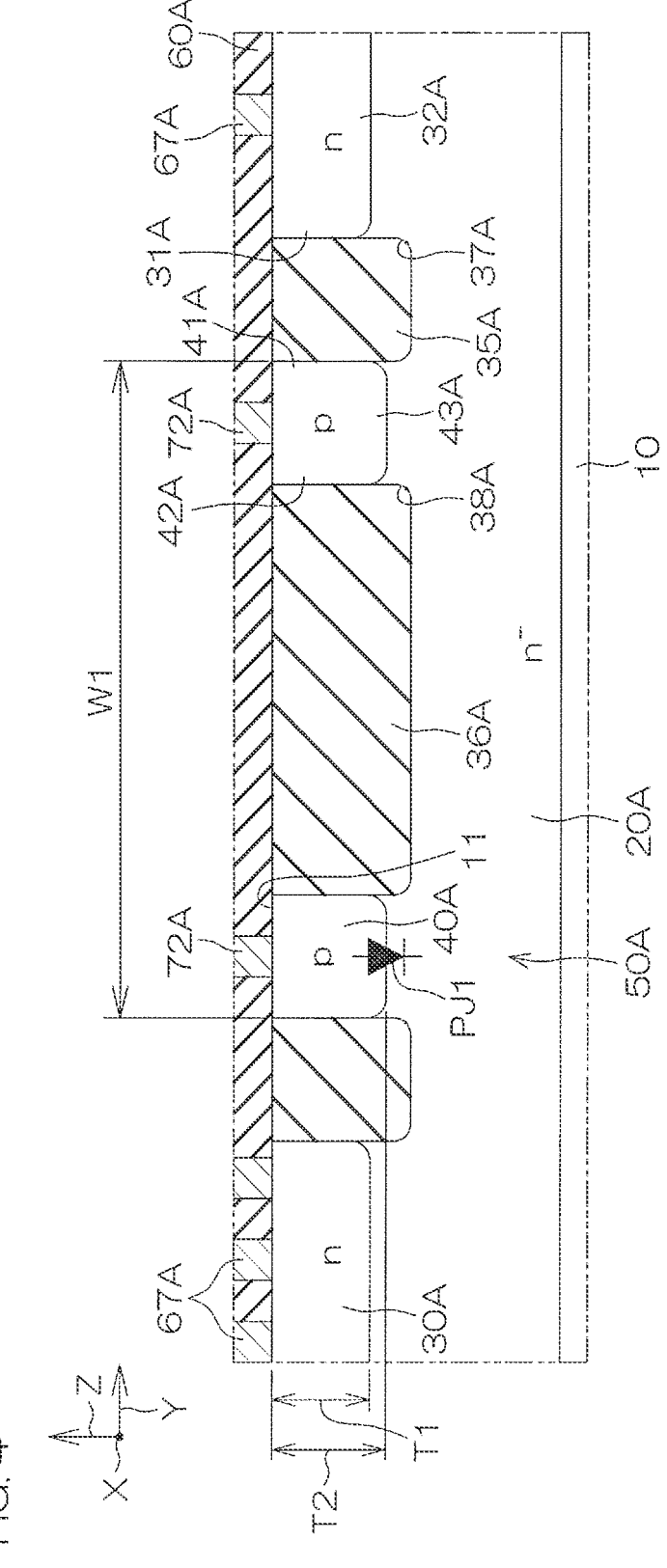
FIG. 4 is an enlarged view of region IV shown in FIG. 3.
Figure 5:
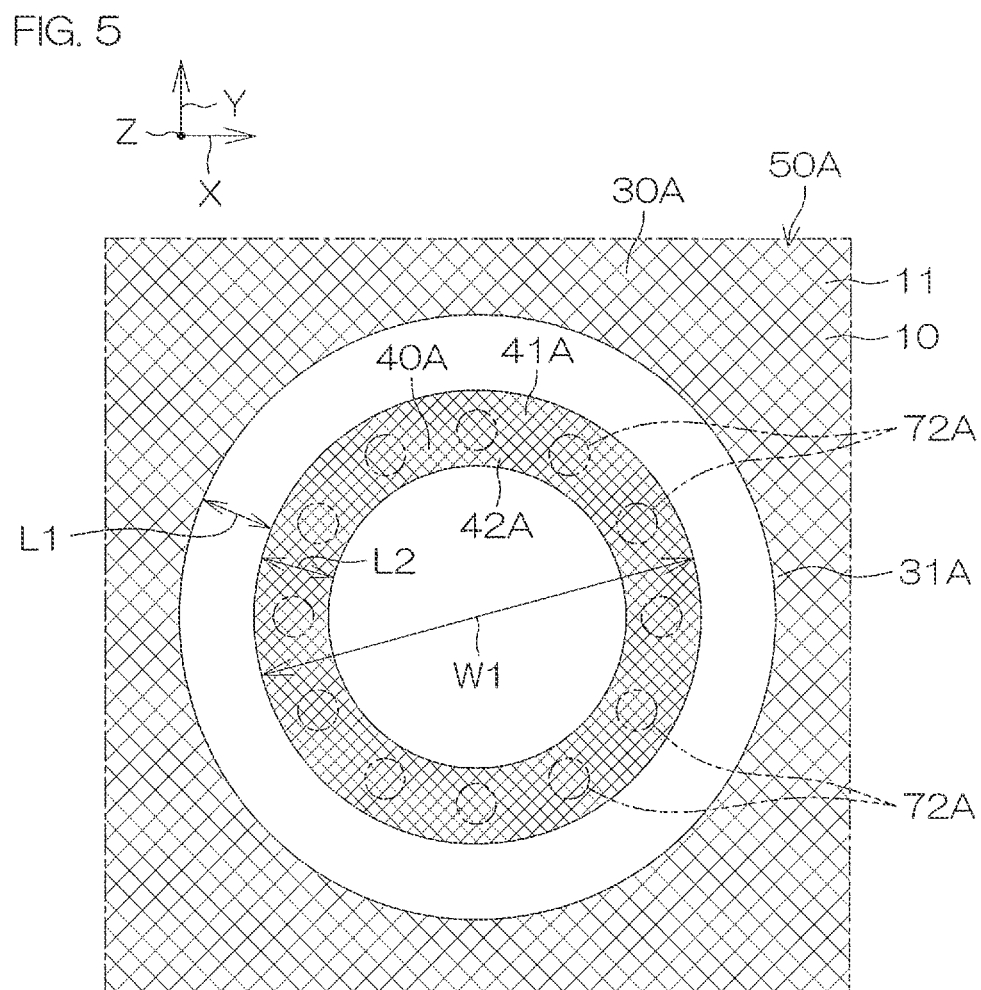
FIG. 5 is an enlarged view of region V shown in FIG. 2.

FIG. 3 is a cross-sectional view taken along line III-III shown in FIG. 2. FIG. 4 is an enlarged view of region IV shown in FIG. 3. FIG. 5 is an enlarged view of region V shown in FIG. 2.

Referring to FIG. 3, the semiconductor layer 10 includes an n-type first well region 20A formed at a surface layer portion of the first principal surface 11 in the first active region 8A. The first principal surface 11 in the first active region 8A is also a surface of the first well region 20A.

For example, N (nitrogen), P (phosphorus), As (arsenic), Sb (antimony), or the like is used as an n-type impurity. The n-type impurity concentration of the first well region 20A may be not less than $1.0 \times 10^{15}$ cm$^{-3}$ and not more than $1.0 \times 10^{18}$ cm$^{-3}$. A thickness TW1 of the first well region 20A is, for example, not less than 1 µm and not more than 1.4 µm, and is, preferably, 1.4 µm.

The first protection element 4A includes a plurality of (in this preferred embodiment, six) n-type (first-conductivity-type) first n-type impurity regions 30A (first impurity regions) formed at a surface layer portion of the surface of the first well region 20A and a plurality of (in this preferred embodiment, six) p-type (second-conductivity-type) first p-type impurity regions 40A (second impurity regions) formed at the surface layer portion of the surface of the first well region 20A (also see FIG. 2). In the n-type impurity regions, a plurality of regions surrounding the first p-type impurity regions 40A are each defined as the first n-type impurity region 30A in FIG. 2. Unlike an example shown in FIG. 2, each of the first n-type impurity regions 30A may be separated from each other by means of, for example, an insulating film although the first n-type impurity regions 30A are connected together and are integrally formed in FIG. 2. The number of the first p-type impurity regions 40A provided here is equal to the number of the first n-type impurity regions 30A.

Referring to FIG. 3 and FIG. 4, the n-type impurity concentration of each of the first n-type impurity regions 30A is, for example, not less than $10 \times 10^{17}$ cm$^{-3}$ and not more than $10 \times 10^{20}$ cm$^{-3}$. For example, N (nitrogen), P (phosphorus), As (arsenic), Sb (antimony), or the like is used as the n-type impurity. A thickness T1 of the first n-type impurity region 30A is, for example, 140 nm.

The first n-type impurity region 30A has a first inner wall portion 31A having a circular shape in a plan view and a first bottom wall portion 32A that is connected to the first inner wall portion 31A and that is contiguous to the first well region 20A. The first bottom wall portion 32A includes a curved portion that protrudes to a side opposite to the first principal surface 11 of the semiconductor layer 10 and a flat portion that connects the curved portions together.

Each of the first p-type impurity regions 40A is placed inside the first inner wall portion 31A corresponding to the first p-type impurity region 40A. In other words, each of the first p-type impurity regions 40A faces the first n-type impurity region 30A corresponding thereto with an interval between the first p-type impurity region 40A and the first n-type impurity region 30A. Each of the first p-type impurity regions 40A is formed in an endless annular shape. In the example of FIG. 2, each of the first p-type impurity regions 40A is formed in a circular shape in a plan view.

The p-type impurity concentration of each of the first p-type impurity regions 40A is, for example, not less than $10 \times 10^{17}$ cm$^{-3}$ and not more than $10 \times 10^{20}$ cm$^{-3}$. For example, B (boron), Al (aluminum), $BF_2$ (compound that contains boron and fluorine), or the like is used as the p-type impurity. A thickness T2 of the first p-type impurity region 40A is larger than the thickness T1 of the first n-type impurity region 30A. The thickness T2 of each of the first p-type impurity regions 40A is, for example, 180 nm.

The first protection element 4A includes a first intermediate insulating layer 35A placed between the first n-type impurity region 30A and the first p-type impurity region 40A and a first inner insulating layer 36A placed inside the first p-type impurity region 40A.

The first intermediate insulating layer 35A is embedded in a first intermediate trench 37A formed by digging the first principal surface 11 down toward the second principal surface 12. An insulator forming the first intermediate insulating layer 35A is optional. The first intermediate insulating layer 35A may include at least one of silicon oxide and silicon nitride.

The first inner insulating layer 36A is embedded in a first inner trench 38A formed by digging the first principal surface 11 down toward the second principal surface 12. An insulator forming the first inner insulating layer 36A is optional. The first inner insulating layer 36A may include at least one of silicon oxide and silicon nitride.

The first p-type impurity region 40A has a first outer wall 41A that is contiguous to the first intermediate insulating layer 35A and that faces the first inner wall portion 31A across the first intermediate insulating layer 35A, a first inner wall 42A contiguous to the first inner insulating layer 36A, and a first bottom wall 43A that connects the first outer wall 41A and the first inner wall 42A together.

The first outer wall 41A is surrounded by the first intermediate insulating layer 35A such that the first outer wall 41A is contiguous to the first intermediate insulating layer 35A. The first inner wall 42A surrounds the first inner insulating layer 36A such that the first inner wall 42A is contiguous to the first inner insulating layer 36A. The first bottom wall 43A is contiguous to the first well region 20A. The first bottom wall 43A includes an outer curved portion and an inner curved portion both of which protrude to a side opposite to the first principal surface 11 of the semiconductor layer 10 and a flat portion that connects the outer curved portion and the inner curved portion together.

The first p-type impurity region 40A forms a pn junction portion PJ1 between the first well region 20A and the first p-type impurity region 40A. The pn junction portion PJ1 is formed near a contact interface between the first p-type impurity region 40A and the first well region 20A. In detail, the pn junction portion PJ1 is formed at a contact interface between the first bottom wall 43A and the first well region 20A.

Referring to FIG. 5, the first inner wall portion 31A of the first n-type impurity region 30A and the first outer wall 41A of the first p-type impurity region 40A corresponding to this first inner wall portion 31A of the first n-type impurity region 30A extend in parallel with each other. A distance L1 between the first inner wall portion 31A of the first n-type impurity region 30A and the first outer wall 41A of the first p-type impurity region 40A corresponding to this first inner wall portion 31A of the first n-type impurity region 30A is constant along a circumferential direction of the first inner wall portion 31A (which is also a circumferential direction of the first outer wall 41A). Additionally, a distance L2 between the first inner wall 42A and the first outer wall 41A of the first p-type impurity region 40A (width of the first bottom wall 43A of the first p-type impurity region 40A) is also constant along a circumferential direction of the first inner wall 42A.

A first diode 50A is formed by the first well region 20A, the first n-type impurity region 30A, and the first p-type impurity region 40A. In the first active region 8A, the first diode 50A is provided as a plurality of first diodes 50A the number of which is equal to that of the first p-type impurity regions 40A (see FIG. 2). In the example of FIG. 2, the first diode 50A is provided as six first diodes 50A.

The first protection element 4A additionally includes a plurality of (in the example of FIG. 3, five) first interlayer insulating films 60A laminated on the first principal surface 11 of the semiconductor layer 10.

The first annular power wiring line 5A is formed on the first interlayer insulating film 60A, which is one of the first interlayer insulating films 60A, such that the first annular power wiring line 5A is contiguous to the first interlayer insulating film 60A. The input-output wiring line 2 is formed on the first interlayer insulating film 60A differing from the first power wiring line 5 such that the input-output wiring line 2 is contiguous to this first interlayer insulating film 60A. In the example of FIG. 3, the first annular power wiring line 5A is formed on the first interlayer insulating film 60A that is farthest from the first principal surface 11, and the input-output wiring line 2 is formed on the first interlayer insulating film 60A that is a third layer from the first principal surface 11.

The first n-type impurity region 30A of the first protection element 4A is electrically connected to the first power wiring line 5, and the first p-type impurity region 40A of the first protection element 4A is electrically connected to the input-output wiring line 2. In detail, the first protection element 4A additionally includes the first connection structure 65A that electrically connects the first n-type impurity region 30A and the first annular power wiring line 5A together and the second connection structure 70A that electrically connects the first p-type impurity region 40A and the input-output wiring line 2 together.

The first connection structure 65A includes a plurality of first via holes 66A each of which passes through any one of the first interlayer insulating films 60A, a plurality of first contact electrodes 67A embedded in the first via holes 66A, respectively, and a plurality of first connection wiring lines 68A that are formed on the first interlayer insulating film 60A and each of which connects the first contact electrodes 67A together.

The second connection structure 70A includes a plurality of second via holes 71A each of which passes through any one of the first interlayer insulating films 60A, a plurality of second contact electrodes 72A embedded in the second via holes 71A, respectively, and a plurality of second connection wiring lines 73A that are formed on the first interlayer insulating film 60A and each of which connects the second contact electrodes 72A together.

The second contact electrodes 72A formed at the first interlayer insulating film 60A contiguous to the first principal surface 11 are placed between the first inner wall 42A and the first outer wall 41A in a plan view (see FIG. 5). The second contact electrodes 72A formed at the first interlayer insulating film 60A contiguous to the first principal surface 11 are equally spaced out along the external shape (first outer wall 41A) of the first p-type impurity region 40A.

Figure 6:
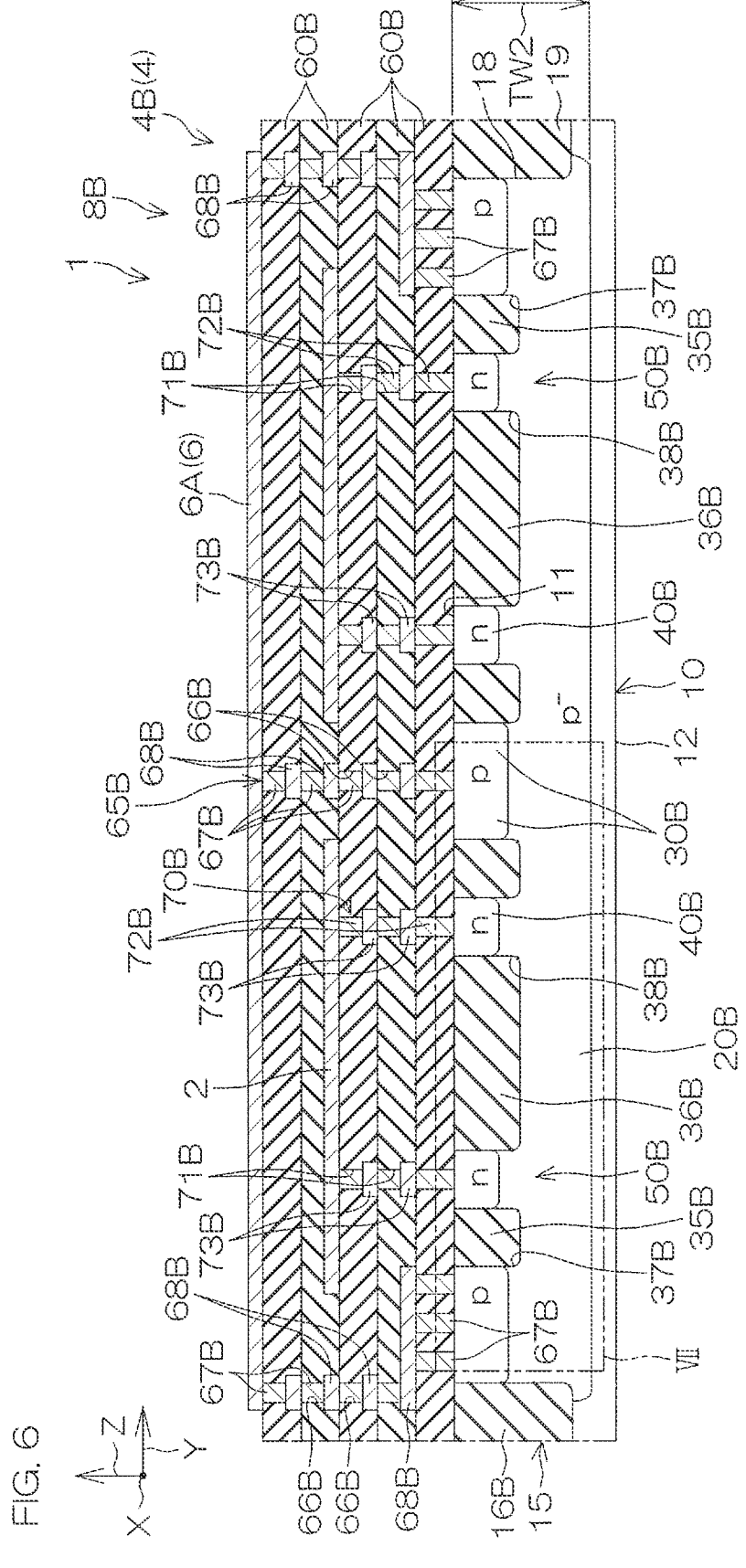
FIG. 6 is a cross-sectional view taken along line VI-VI shown in FIG. 2.
Figure 7:
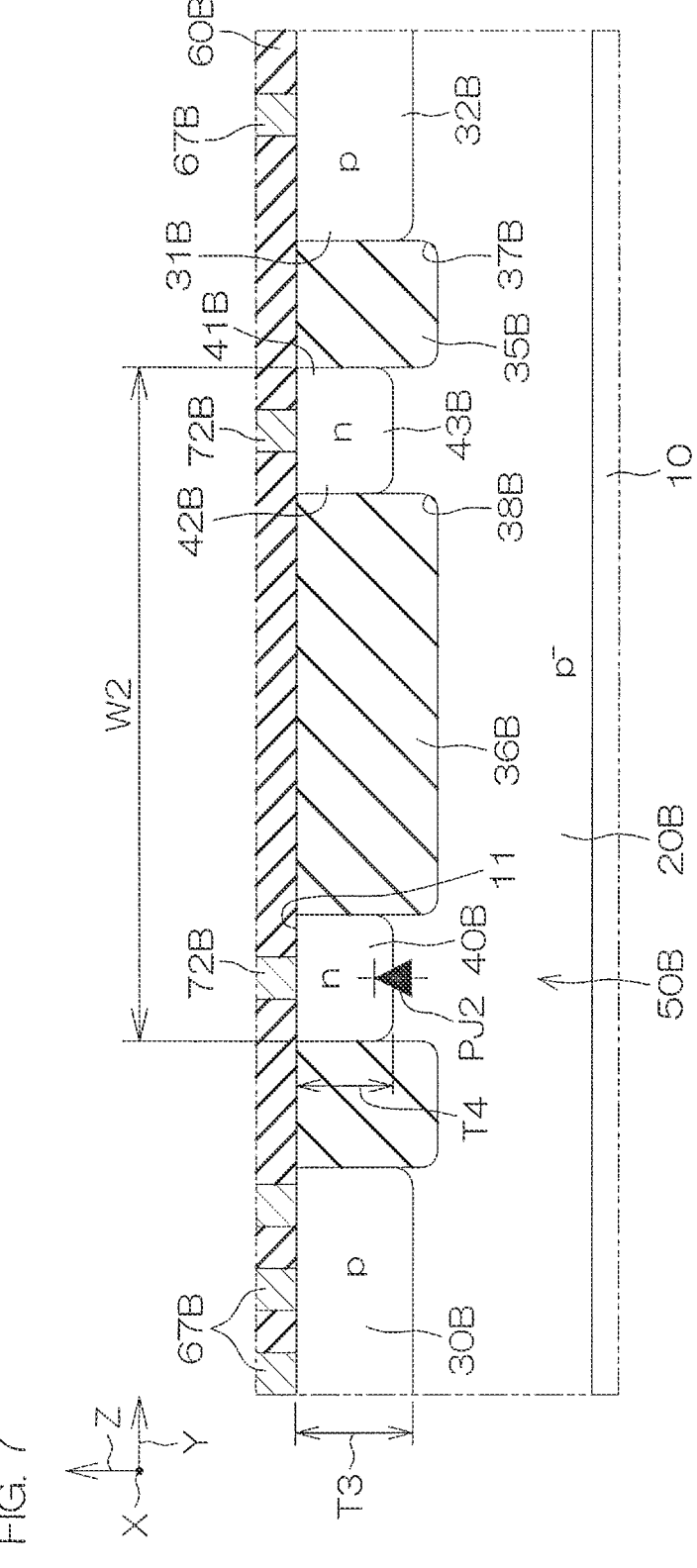
FIG. 7 is an enlarged view of region VII shown in FIG. 6.
Figure 8:
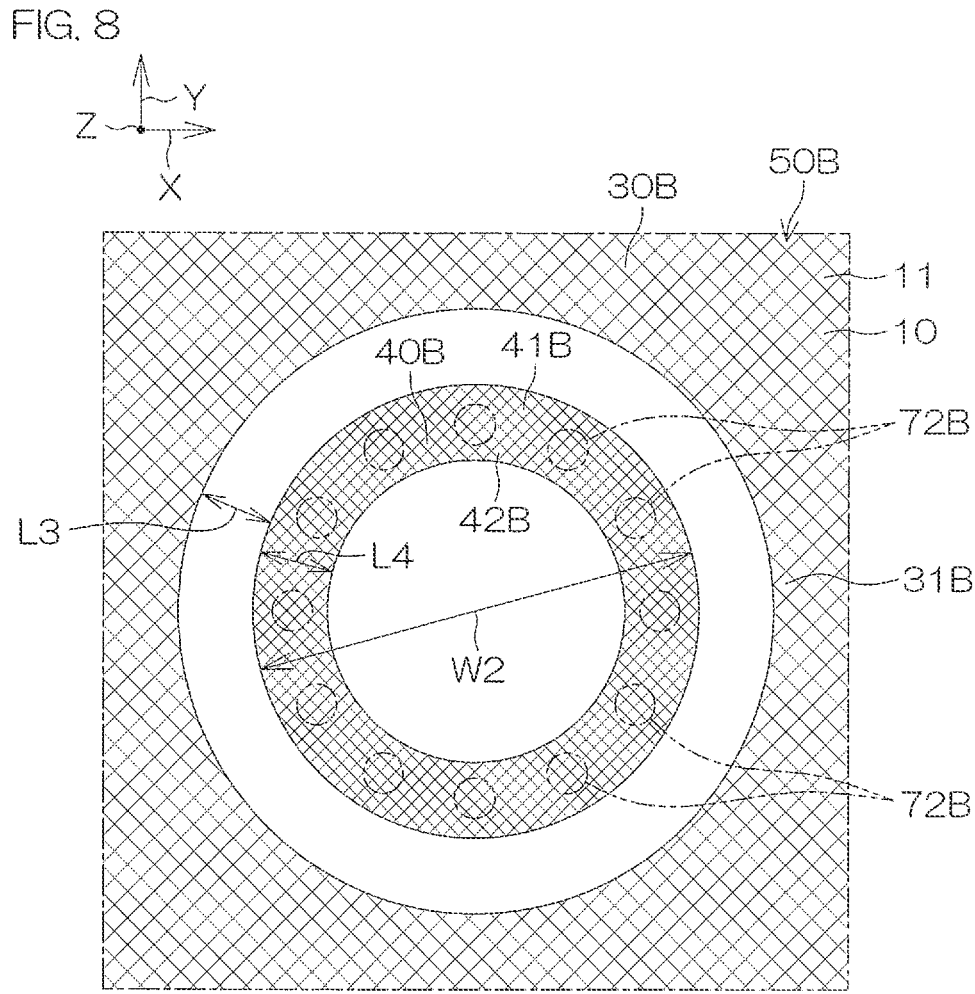
FIG. 8 is an enlarged view of region VIII shown in FIG. 2.

FIG. 6 is a cross-sectional view taken along line VI-VI shown in FIG. 2. FIG. 7 is an enlarged view of region VII shown in FIG. 6. FIG. 8 is an enlarged view of region VIII shown in FIG. 2.

Referring to FIG. 6, the semiconductor layer 10 additionally includes a p-type second well region 20B formed at the surface layer portion of the first principal surface 11 in the second active region 8B. The first principal surface 11 in the second active region 8B is also a surface of the second well region 20B. For example, B (boron), Al (aluminum), $BF_2$ (compound that contains boron and fluorine), or the like is used as the p-type impurity. The p-type impurity concentration of the second well region 20B may be not less than $1.0 \times 10^{15} \, cm^{-3}$ and not more than $1.0 \times 10^{18} \, cm^{-3}$. A thickness TW2 of the second well region 20B is, for example, not less than 1 μm and not more than 1.4 μm, and is, preferably, 1.0 μm.

The second protection element 4B includes a plurality of p-type (first-conductivity-type) second p-type impurity regions 30B (first impurity regions) formed at a surface layer portion of the surface of the second well region 20B and a plurality of n-type (second-conductivity-type) second n-type impurity regions 40B (second impurity regions) formed at the surface layer portion of the surface of the second well region 20B. The number of the second n-type impurity regions 40B provided here is equal to the number of the second p-type impurity regions 30B (see FIG. 2). In FIG. 2, in the p-type impurity regions, a plurality of regions surrounding the second n-type impurity regions 40B are set as the second p-type impurity regions 30B, respectively. Unlike the example shown in FIG. 2, each of the second p-type impurity regions 30B may be separated from each other by means of, for example, an insulating film although the second p-type impurity regions 30B are connected together and are integrally formed in FIG. 2.

Referring to FIG. 6 and FIG. 7, the p-type impurity concentration of each of the second p-type impurity regions 30B is, for example, not less than $10 \times 10^{17} \, cm^{-3}$ and not more than $10 \times 10^{20} \, cm^{-3}$. For example, B (boron), Al (aluminum), $BF_2$ (compound that contains boron and fluorine), or the like is used as the p-type impurity. A thickness T3 of the second p-type impurity region 30B is, for example, 180 nm.

The second p-type impurity region 30B has a second inner wall portion 31B having a circular shape in a plan view and a second bottom wall portion 32B that is connected to the second inner wall portion 31B and that is contiguous to the second well region 20B. The second bottom wall portion 32B includes a curved portion that protrudes to a side opposite to the first principal surface 11 of the semiconductor layer 10 and a flat portion that connects the curved portions together.

Each of the second n-type impurity regions 40B is placed inside the second inner wall portion 31B corresponding to the second n-type impurity region 40B. In other words, each of the second n-type impurity regions 40B faces the second p-type impurity region 30B corresponding to the second n-type impurity region 40B with an interval between the second n-type impurity region 40B and the second p-type impurity region 30B. Each of the second n-type impurity regions 40B is formed in an endless annular shape. In the example of FIG. 2, each of the second n-type impurity regions 40B is formed in a circular shape in a plan view.

The p-type impurity concentration of each of the second n-type impurity regions 40B is, for example, not less than $10 \times 10^{17}$ cm$^{-3}$ and not more than $10 \times 10^{20}$ cm$^{-3}$. For example, N (nitrogen), P (phosphorus), As (arsenic), or the like is used as the n-type impurity. A thickness T4 of the second n-type impurity region 40B is smaller than the thickness T3 of the second p-type impurity region 30B. The thickness T4 of each of the second n-type impurity regions 40B is, for example, 140 nm.

The second protection element 4B includes a second intermediate insulating layer 35B placed between the second p-type impurity region 30B and the second n-type impurity region 40B and a second inner insulating layer 36B placed inside the second n-type impurity region 40B.

The second intermediate insulating layer 35B is embedded in a second intermediate trench 37B formed by digging the first principal surface 11 down toward the second principal surface 12. An insulator forming the second intermediate insulating layer 35B is optional. The second intermediate insulating layer 35B may include at least one of silicon oxide and silicon nitride.

The second inner insulating layer 36B is embedded in a second inner trench 38B formed by digging the first principal surface 11 down toward the second principal surface 12. An insulator forming the second inner insulating layer 36B is optional. The second inner insulating layer 36B may include at least one of silicon oxide and silicon nitride.

The second n-type impurity region 40B has a second outer wall 41B that is contiguous to the second intermediate insulating layer 35B and that faces the second inner wall portion 31B across the second intermediate insulating layer 35B, a second inner wall 42B contiguous to the second inner insulating layer 36B, and a second bottom wall 43B that connects the second outer wall 41B and the second inner wall 42B together.

The second outer wall 41B is surrounded by the second intermediate insulating layer 35B such that the second outer wall 41B is contiguous to the second intermediate insulating layer 35B. The second inner wall 42B surrounds the second inner insulating layer 36B such that the second inner wall 42B is contiguous to the second inner insulating layer 36B. The second bottom wall 43B is contiguous to the second well region 20B. The second bottom wall 43B includes an outer curved portion and an inner curved portion both of which protrude to a side opposite to the first principal surface 11 of the semiconductor layer 10 and a flat portion that connects the outer curved portion and the inner curved portion together.

The second n-type impurity region 40B forms a pn junction portion PJ2 between the second well region 20B and the second n-type impurity region 40B. The pn junction portion PJ2 is formed near a contact interface between the second n-type impurity region 40B and the second well region 20B. In detail, the pn junction portion PJ2 is formed at a contact interface between the second bottom wall 43B and the second well region 20B.

Referring to FIG. 8, the second inner wall portion 31B of the second p-type impurity region 30B and the second outer wall 41B of the second n-type impurity region 40B corresponding to the second inner wall portion 31B of the second p-type impurity region 30B extend in parallel with each other. A distance L3 between the second inner wall portion 31B of the second p-type impurity region 30B and the second outer wall 41B of the second n-type impurity region 40B corresponding to the second inner wall portion 31B of the second p-type impurity region 30B is constant along a circumferential direction of the second inner wall portion 31B (which is also a circumferential direction of the second outer wall 41B). Additionally, a distance L4 between the second inner wall 42B and the second outer wall 41B of the second n-type impurity region 40B (width of the second bottom wall 43B of the second n-type impurity region 40B) is also constant along a circumferential direction of the second inner wall 42B.

A second diode 50B is formed by the second well region 20B, the second p-type impurity regions 30B, and the second n-type impurity region 40B. In the second active region 8B, the second diode 50B is provided as a plurality of second diodes 50B the number of which is equal to that of the second n-type impurity regions 40B (see FIG. 2). In the example of FIG. 2, the second diode 50B is provided as six second diodes 50B.

The second protection element 4B additionally includes a plurality of (in the example of FIG. 6, five) second interlayer insulating films 60B laminated on the first principal surface 11 of the semiconductor layer 10.

The second annular power wiring line 6A is formed on the second interlayer insulating film 60B, which is one of the second interlayer insulating films 60B, such that the second annular power wiring line 6A is contiguous to this second interlayer insulating film 60B. The input-output wiring line 2 is formed on the second interlayer insulating film 60B such that the input-output wiring line 2 is contiguous to this second interlayer insulating film 60B differing from the second power wiring line 6. In the example of FIG. 6, the second annular power wiring line 6A is formed on the second interlayer insulating film 60B farthest from the first principal surface 11, and the input-output wiring line 2 is formed on the second interlayer insulating film 60B that is the third layer from the first principal surface 11.

The second n-type impurity region 40B of the second protection element 4B is electrically connected to the input-output wiring line 2, and the second p-type impurity region 30B of the second protection element 4B is electrically connected to the second power wiring line 6. In detail, the second protection element 4B additionally includes the third connection structure 65B that electrically connects the second p-type impurity region 30B and the second power wiring line 6 together and the fourth connection structure 70B that electrically connects the second n-type impurity region 40B and the input-output wiring line 2 together.

The third connection structure 65B includes a plurality of third via holes 66B each of which passes through any one of the second interlayer insulating films 60B, a plurality of third contact electrodes 67B embedded in the third via holes 66B, respectively, and a plurality of third connection wiring lines 68B that are formed on the second interlayer insulating film 60B and each of which connects the third contact electrodes 67B together.

The fourth connection structure 70B includes a plurality of fourth via holes 71B each of which passes through any one of the second interlayer insulating films 60B, a plurality of fourth contact electrodes 72B embedded in the fourth via holes 71B, respectively, and a plurality of fourth connection wiring lines 73B that are formed on the second interlayer insulating film 60B and each of which connects the fourth contact electrodes 72B together.

The fourth contact electrodes 72B formed at the second interlayer insulating film 60B contiguous to the first principal surface 11 are placed between the second inner wall 42B and the second outer wall 41B in a plan view (see FIG. 8). The fourth contact electrodes 72B formed at the second interlayer insulating film 60B contiguous to the first principal surface 11 are equally spaced out along the external shape (second outer wall 41B) of the first p-type impurity region 40A.

Figure 9:
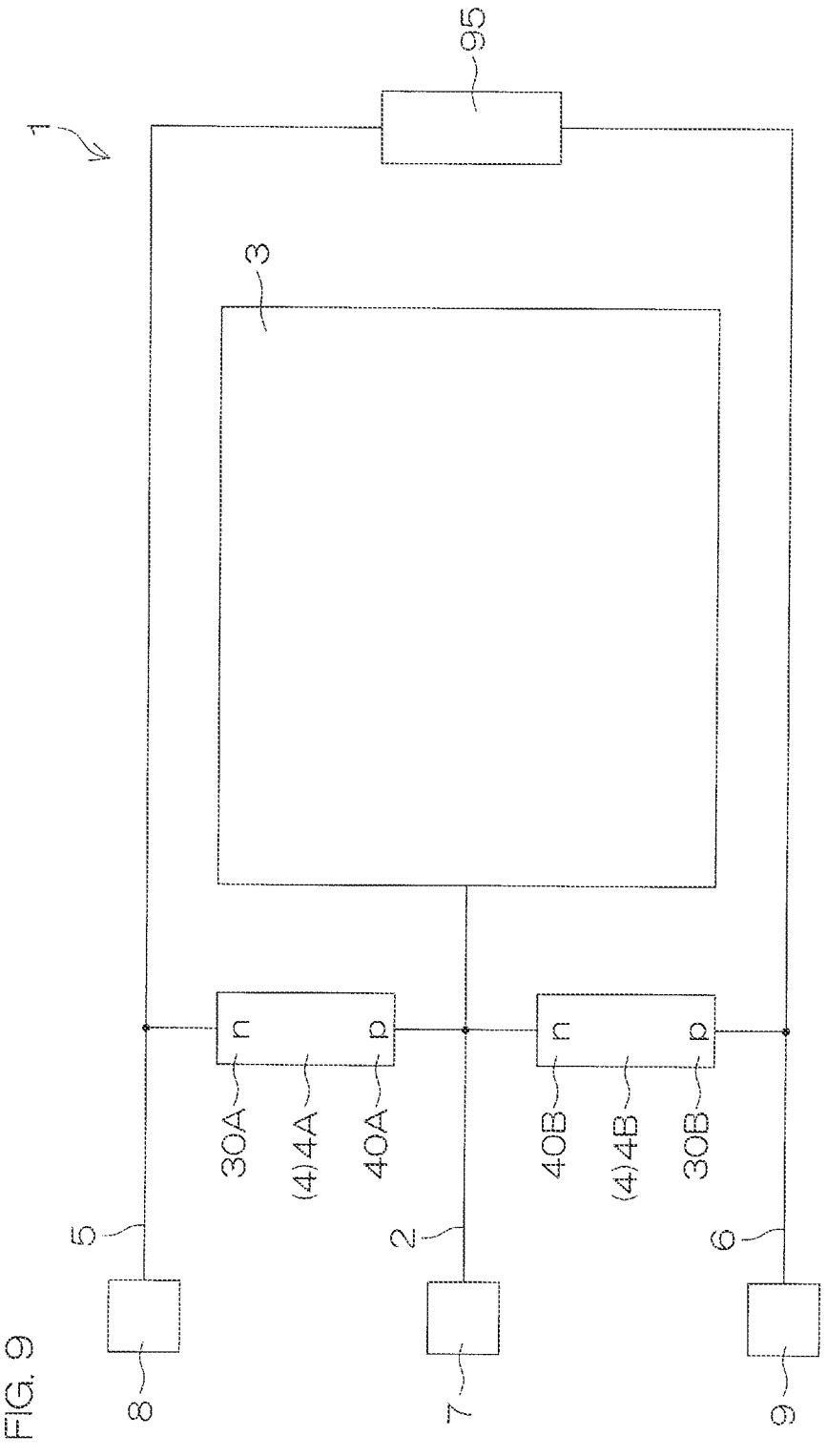
FIG. 9 is a schematic view of an electric circuit of the semiconductor device shown in FIG. 1.

FIG. 9 is a schematic view of an electric circuit of the IC chip 1 shown in FIG. 1.

A signal input into the input-output pad 7 is input into the internal circuit 3 through the input-output wiring line 2. A signal output from the internal circuit 3 is output from the input-output pad 7 to the outside through the input-output wiring line 2.

There is a case in which an overvoltage based on ESD etc., is input into the input-output pad 7. The electric potential of the input-output pad 7 increases if the overvoltage input into the input-output pad 7 is a positive overvoltage. Hence, the first protection element 4A operates in a forward direction, and an ESD current flows through the first power wiring line 5. As a result, the internal circuit 3 is protected from the positive overvoltage.

If the overvoltage input into the input-output pad 7 is a negative overvoltage, an electric potential between the input-output pad 7 and the second power pad 9 decreases, and hence the second protection element 4B operates in the forward direction, and an ESD current flows through the second power wiring line 6. As a result, the internal circuit 3 is protected from the negative overvoltage.

Figure 10A:
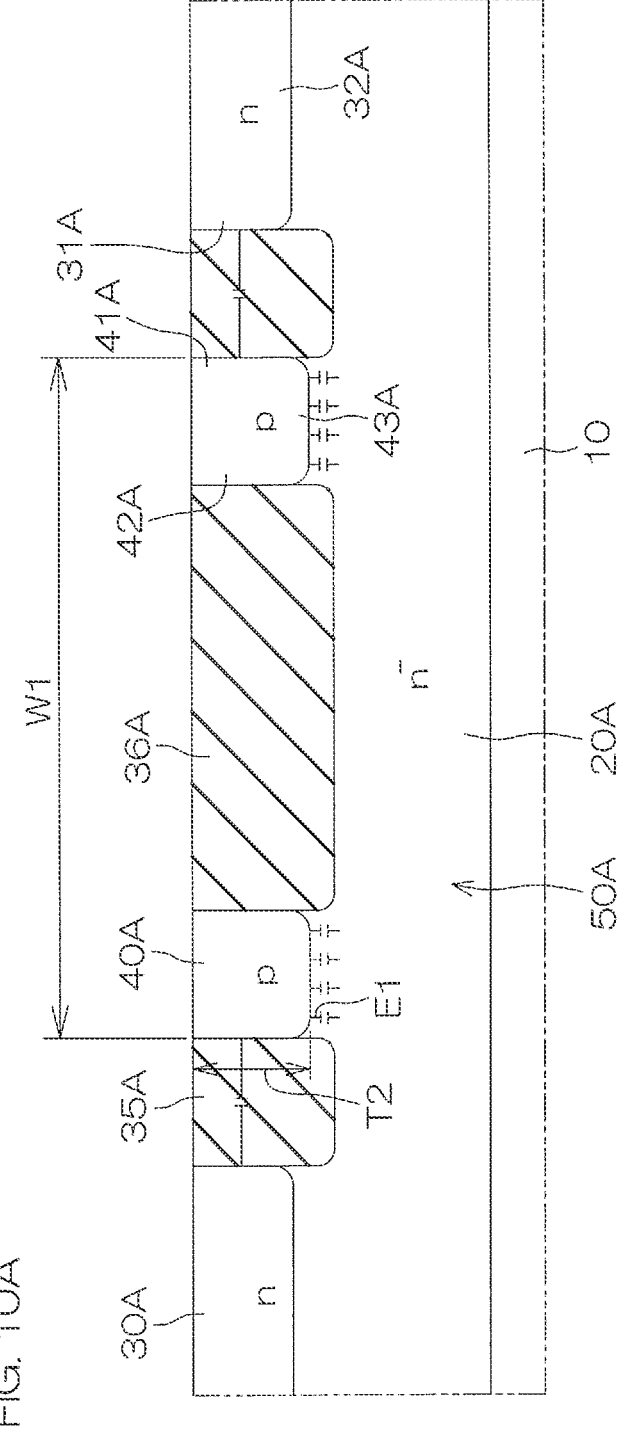
FIG. 10A is a schematic view shown to describe an aspect in which electric charge has been accumulated in a first diode included in the protection element.

FIG. 10A is a schematic view shown to describe an aspect in which electric charge has been accumulated in the first diode 50A of the first protection element 4A.

The first well region 20A and the first p-type impurity region 40A form the pn junction portion PJ1 (see FIG. 4), and therefore electric charge E1 is accumulated near an interface between the first bottom wall 43A of the first p-type impurity region 40A and the first well region 20A.

Figure 16A:
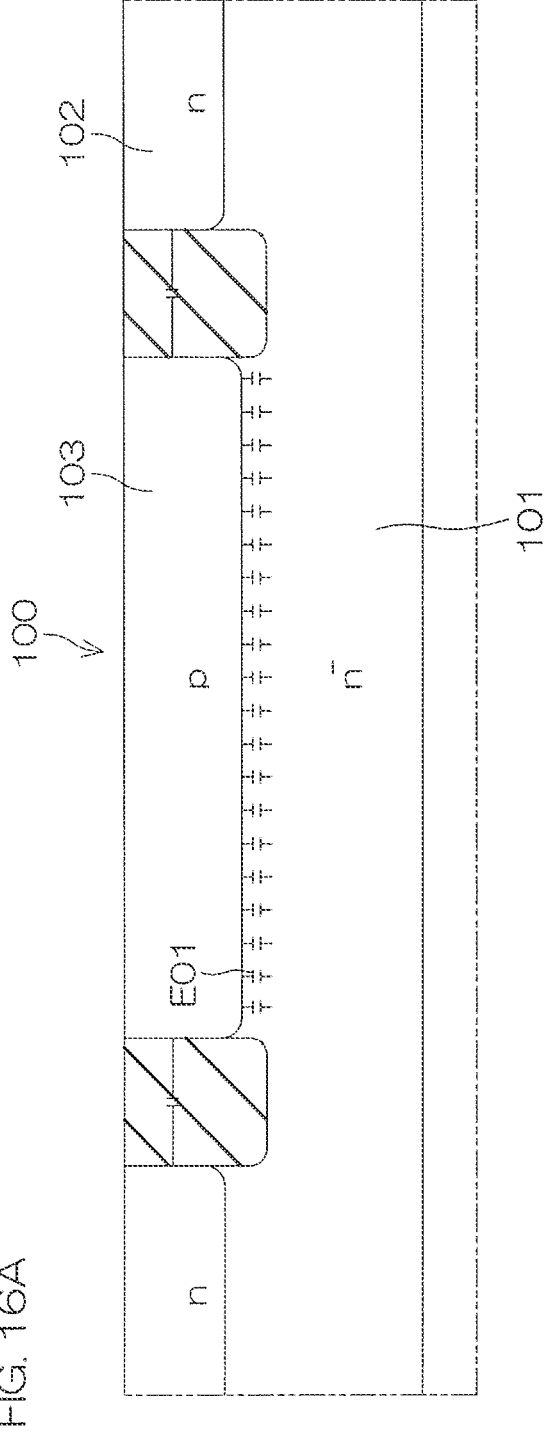
FIG. 16A is a schematic view shown to describe an aspect in which electric charge has been accumulated in a diode of a first reference example.

Here, unlike this preferred embodiment, let it be supposed that a diode 100 of a first reference example is provided in which the shape of a p-type impurity region 103 placed inside an n-type impurity region 102 is, for example, circular in a plan view, not annular, in a surface layer portion of a principal surface of a well region 101 as shown in FIG. 16A.

In the first diode 50A according to the preferred embodiment shown in FIG. 10A, the first p-type impurity region 40 has a circular shape in a plan view, hence making it possible to make the area of an interface between the first p-type impurity region 40A and the first well region 20A smaller when compared to the diode 100 of the first reference example shown in FIG. 16A.

Therefore, the electric charge E1 (see FIG. 10A) accumulated near the interface between the first p-type impurity region 40A and the first well region 20A is smaller than electric charge E01 (see FIG. 16A) accumulated near an interface between the p-type impurity region 103 and the well region 101 of the diode 100 of the first reference example. Therefore, the electrostatic capacity of the first diode 50A is smaller than the electrostatic capacity of the diode 100 of the first reference example.

Particularly if the thickness T2 of the first p-type impurity region 40A is smaller than a width W1 of the first p-type impurity region 40A in a plan view, it is possible to reduce an amount of increase in area of the interface between the first p-type impurity region 40A and the first well region 20A. Therefore, the electrostatic capacity is enabled to be further reduced. If the first p-type impurity region 40A has a circular shape in a plan view, the width W1 of the first p-type impurity region 40A is an outer diameter of the first p-type impurity region 40A.

Figure 10B:
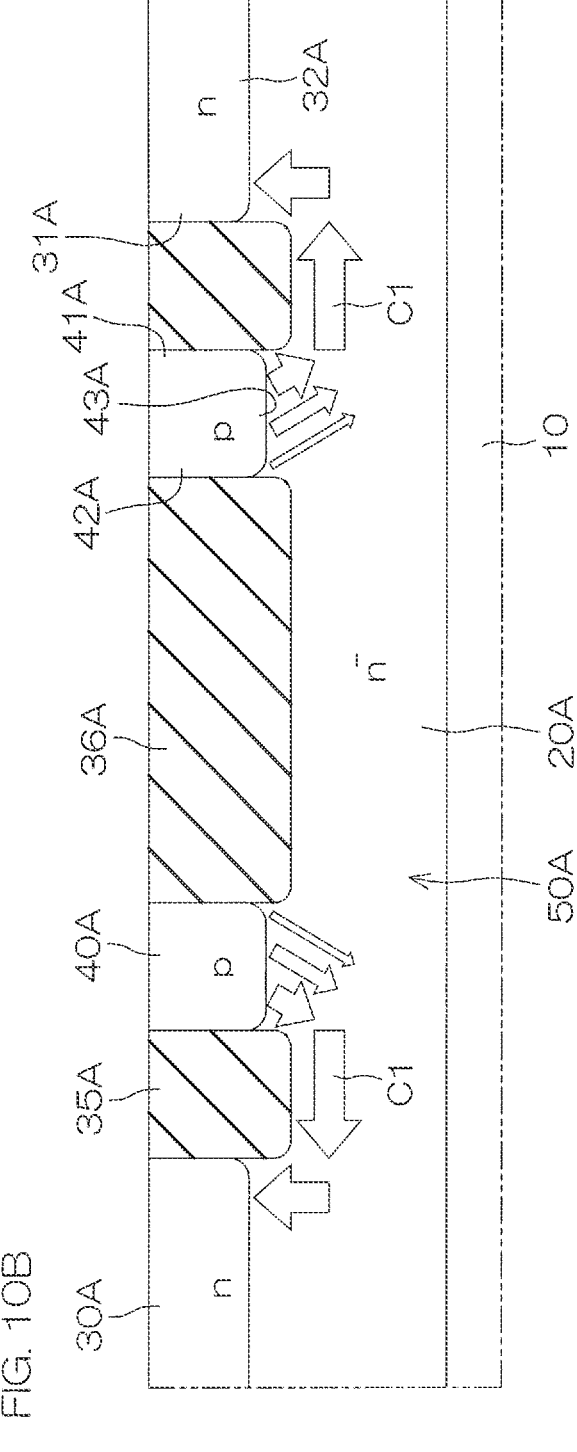
FIG. 10B is a schematic view shown to describe an aspect in which an ESD current flows through the first diode.

FIG. 10B is a schematic view shown to describe an aspect in which an ESD current flows through the first diode 50A.

An ESD current C1 flows through a part, which is contiguous to the first well region 20A, of the first p-type impurity region 40A. The ESD current C1 is predominant in a part, which is close to the first n-type impurity region 30A, of the first p-type impurity region 40A. In detail, a contribution to an ESD current capability of a part, which is far from the first n-type impurity region 30A, of the first p-type impurity region 40A is much smaller than a contribution to an ESD current capability of the part, which is close to the first n-type impurity region 30A, of the first p-type impurity region 40A. In other words, the amount of current of the part, which is far from the first n-type impurity region 30A, of the first p-type impurity region 40A is smaller than the amount of current of the part, which is close to the first n-type impurity region 30A, of the first p-type impurity region 40.

Therefore, if the first p-type impurity region 40A has an annular shape in a plan view as shown in FIG. 10B, it is possible to maintain contact between the part, which is close to the first n-type impurity region 30A, of the first p-type impurity region 40A and the first well region 20A, hence making it possible to improve the ESD current C1 per capacity, i.e., improve efficiency. Therefore, it is possible to secure an ESD current capability equivalent to a configuration in which the p-type impurity region 103 shown in FIG. 16B has a circular shape in a plan view. Therefore, it is possible to sufficiently secure an ESD current capability even if the first p-type impurity region 40A has an annular shape. In other words, it is possible to restrain a decrease in ESD resistance properties.

Figure 16B:
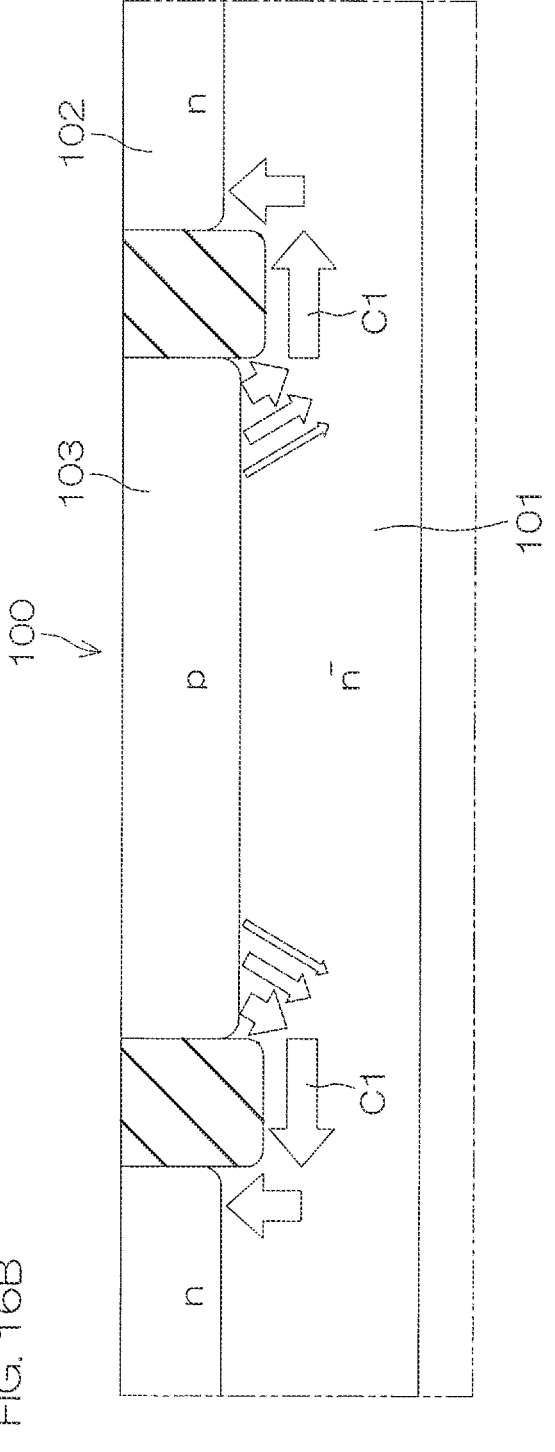
FIG. 16B is a schematic view shown to describe an aspect in which an ESD current flows through the diode of the first reference example.

Additionally, in the diode 100 of the first reference example shown in FIG. 16B, a contact interface between a part which is close to the center of the p-type impurity region 103 whose shape is circular in a plan view and the well region 101 hardly affects the ESD resistance properties.

As thus described, it is possible to restrain a decrease in the ESD tolerance and to reduce the electrostatic capacity if the first p-type impurity region 40 is annular.

Figure 11A:
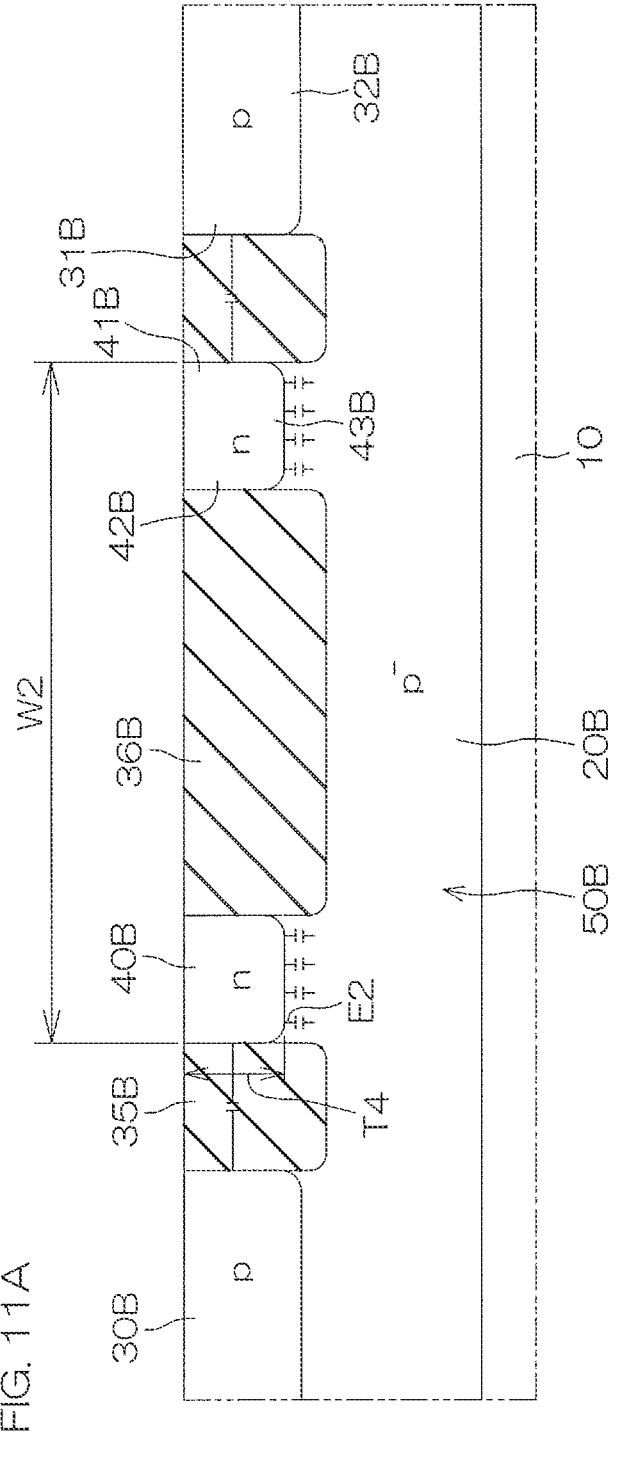
FIG. 11A is a schematic view shown to describe an aspect in which electric charge has been accumulated in a second diode included in the protection element.

FIG. 11A is a schematic view shown to describe an aspect in which electric charge has been accumulated in the second diode 50 of the second protection element 4B.

The second well region 20B and the second n-type impurity region 40B form the pn junction portion PJ2 (see FIG. 7), and therefore electric charge E2 is accumulated near an interface between the second bottom wall 43B of the second n-type impurity region 40B and the second well region 20B.

Figure 17A:
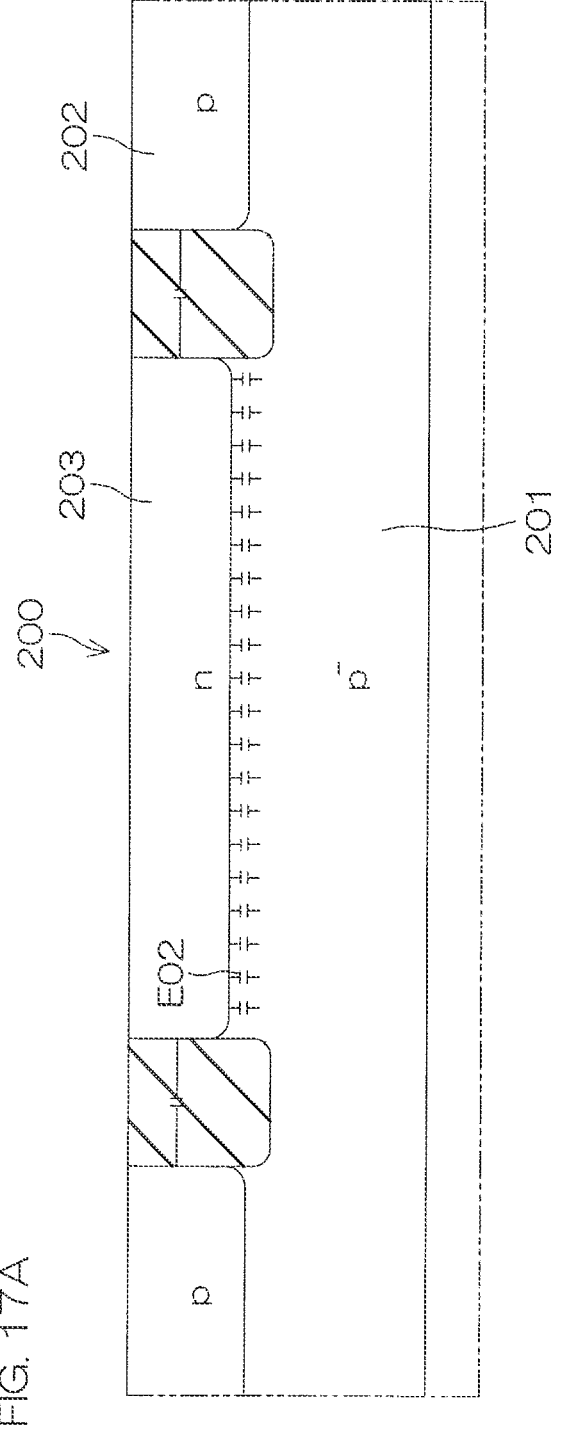
FIG. 17A is a schematic view shown to describe an aspect in which electric charge has been accumulated in a diode of a second reference example.

Here, unlike this preferred embodiment, let it be supposed that a diode 200 of a second reference example is provided in which the shape of an n-type impurity region 203 placed inside a p-type impurity region 202 is, for example, circular in a plan view, not annular, in a surface layer portion of a principal surface of a well region 201 as shown in FIG. 17A.

In the second diode 50B according to the preferred embodiment shown in FIG. 11A, the second n-type impurity region 40B has a circular shape in a plan view, hence making it possible to make the area of an interface between the second n-type impurity region 40B and the second well region 20B smaller when compared to the diode 200 of the second reference example shown in FIG. 17A.

Therefore, the electric charge E2 (see FIG. 11A) accumulated near the interface between the second n-type impurity region 40B and the second well region 20B is smaller than electric charge E02 (see FIG. 17A) accumulated near an interface between the n-type impurity region 203 and the well region 201 of the diode 200 of the second reference example. Therefore, the electrostatic capacity of the second diode 50B is smaller than the electrostatic capacity of the diode 200 of the second reference example.

Particularly if the thickness T4 of the second n-type impurity region 40B is smaller than a width W2 of the second n-type impurity region 40B in a plan view, it is possible to reduce an amount of increase in area of the interface between the second n-type impurity region 40B and the second well region 20B. Therefore, the electrostatic capacity is enabled to be further reduced. If the second n-type impurity region 40B has a circular shape in a plan view, the width W2 of the second n-type impurity region 40B is an outer diameter of the second n-type impurity region 40B.

Figure 11B:
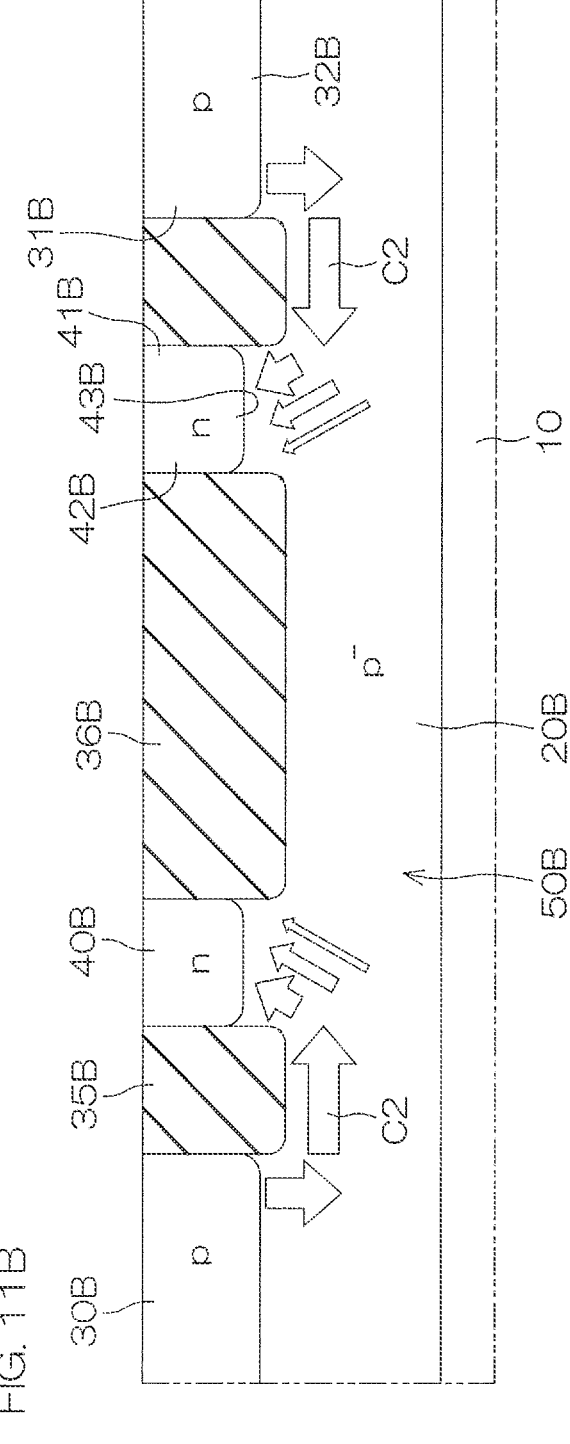
FIG. 11B is a schematic view shown to describe an aspect in which an ESD current flows through the second diode.

FIG. 11B is a schematic view shown to describe an aspect in which an ESD current flows through the second diode 50B.

An ESD current C2 is predominant in a part, which is close to the second p-type impurity region 30B, of the second n-type impurity region 40B in the same way as the ESD current C1 of FIG. 10B. Therefore, if the second n-type impurity region 40B has an annular shape in a plan view as shown in FIG. 11B, it is possible to maintain contact between the part, which is close to the second p-type impurity region 30B, of the second n-type impurity region 40B and the second well region 20B, hence making it possible to improve the ESD current C2 per capacity, i.e., improve efficiency. Therefore, it is possible to secure an ESD current capability equivalent to a configuration in which the n-type impurity region 203 shown in FIG. 17B has a circular shape in a plan view. Therefore, it is possible to sufficiently secure an ESD current capability even if the second n-type impurity region 40B has an annular shape. In other words, it is possible to restrain a decrease in ESD resistance properties.

Figure 17B:
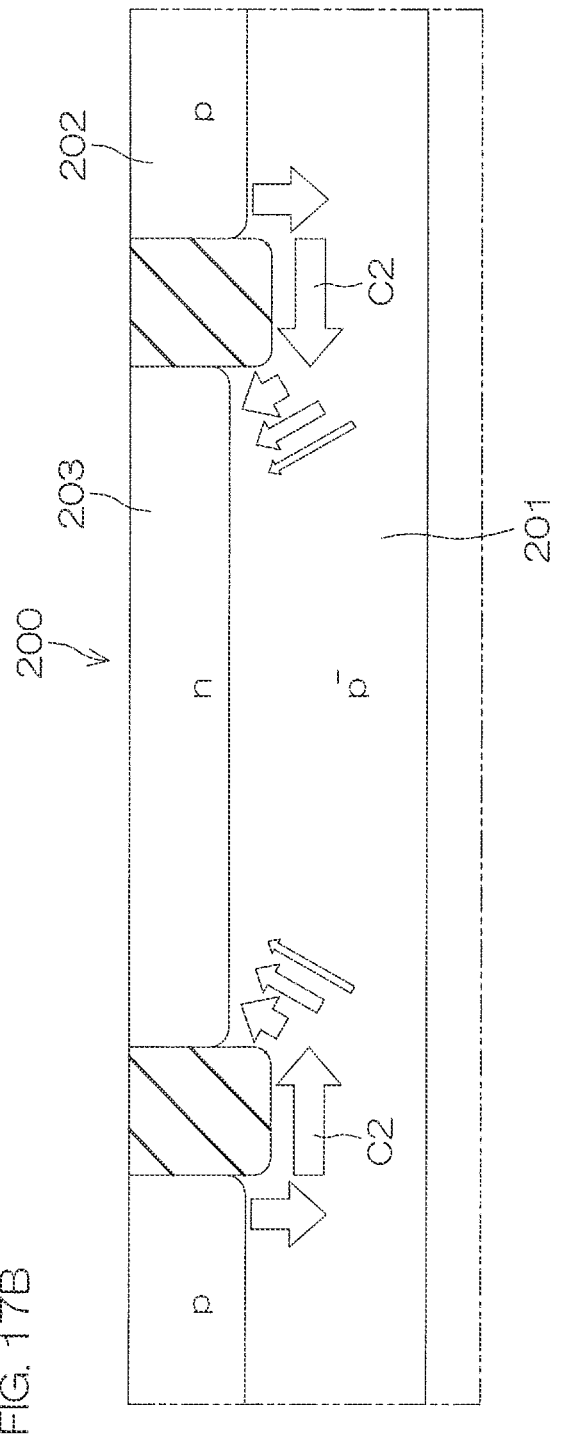
FIG. 17B is a schematic view shown to describe an aspect in which an ESD current flows through the diode of the second reference example.

Additionally, in the diode 200 of the second reference example shown in FIG. 17B, a contact interface between a part which is close to the center of the n-type impurity region 203 whose shape is circular in a plan view and the well region 201 hardly affects the ESD resistance properties.

As thus described, it is possible to restrain a decrease in the ESD tolerance and to reduce the electrostatic capacity if the second n-type impurity region 40B is annular.

With this preferred embodiment, the first p-type impurity region 40A and the second n-type impurity region 40B are annular, hence making it possible to reduce the charge amount of both the first p-type impurity region 40A and the second n-type impurity region 40B that are connected to the input-output wiring line 2. Therefore, it is possible to improve the speed of an electric signal input into the internal circuit 3.

Next, first to fifth modifications of the diodes 50A and 50B of the protection element 4 according to this preferred embodiment will be described.

Figure 12:
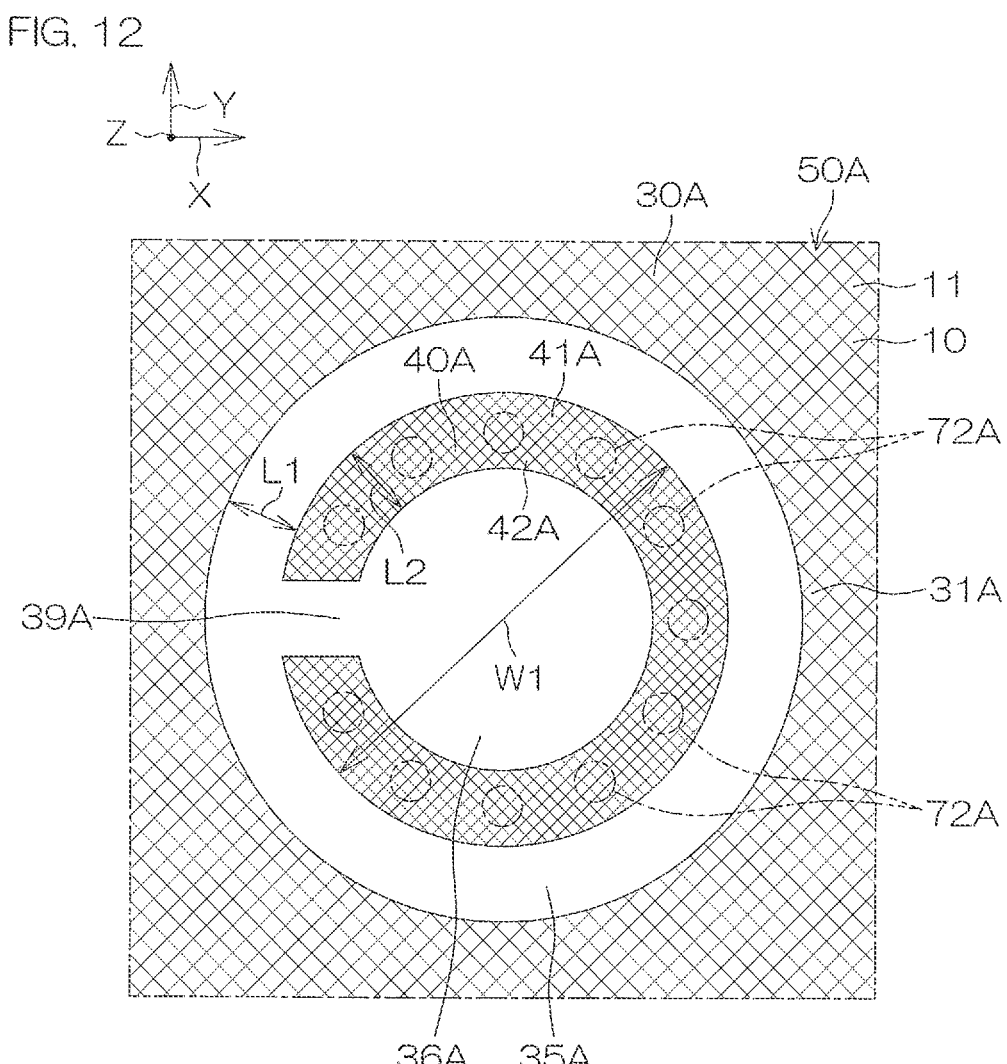
FIG. 12 is a plan view of a diode of a first modification.

FIG. 12 is a plan view of the first diode 50A of the first modification. In the first diode 50A of the first modification, the first p-type impurity region 40A has an ended circular shape unlike the first diode 50A shown in FIG. 6. The first p-type impurity region 40A has the shape of, for example, the capital letter C.

The first p-type impurity region 40A has an ended circular shape, and therefore the first intermediate insulating layer 35A and the first inner insulating layer 36A are connected together by means of a connection insulating layer 39A.

If the first p-type impurity region 40A has an ended circular shape in a plan view, the width W1 of the first p-type impurity region 40A is an outer diameter of the first p-type impurity region 40A.

In the second diode 50B, the same modification can be applied (not shown). In detail, the second n-type impurity region 40B may have an ended circular shape (for example, the capital letter C). In this case, the second intermediate insulating layer 35B and the second inner insulating layer 36B are connected together by means of a connection insulating layer.

Figure 13:
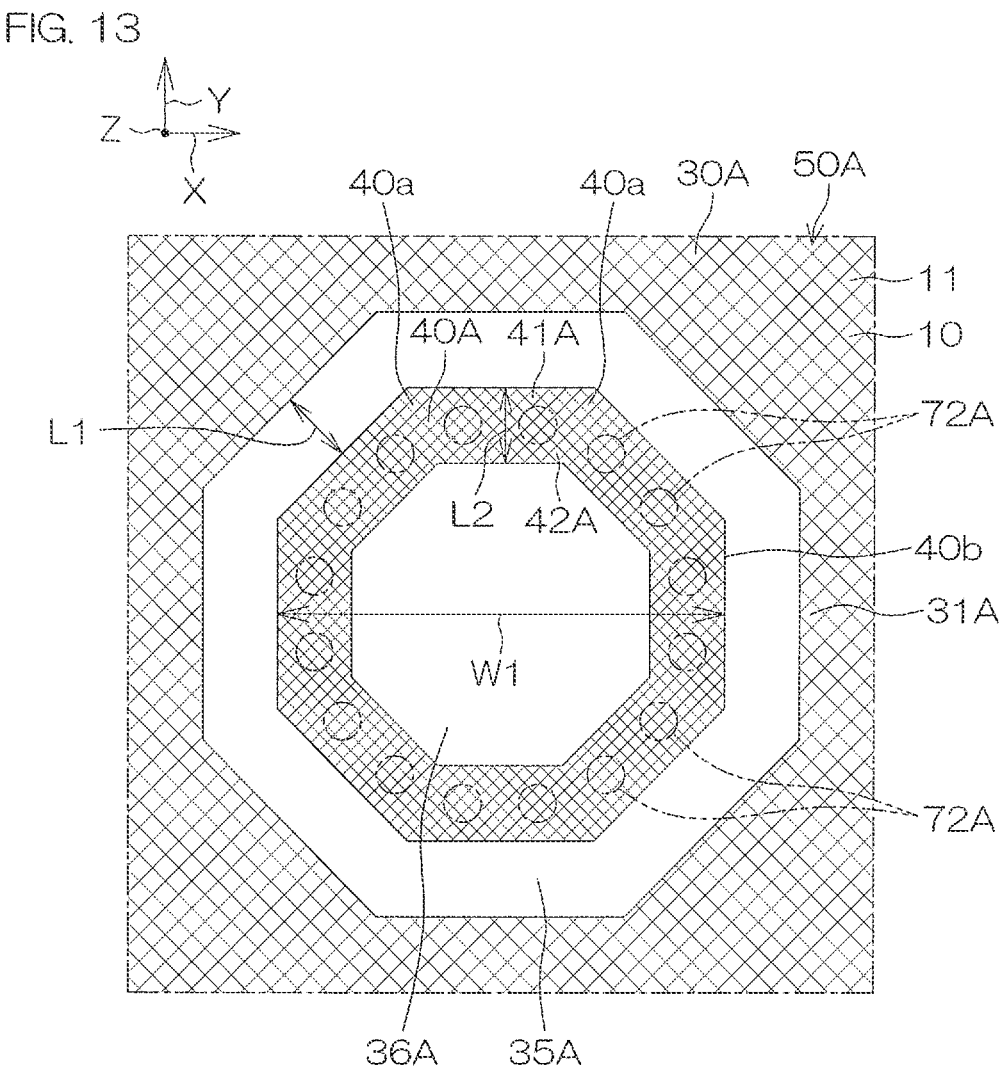
FIG. 13 is a plan view of a diode of a second modification.
Figure 14:
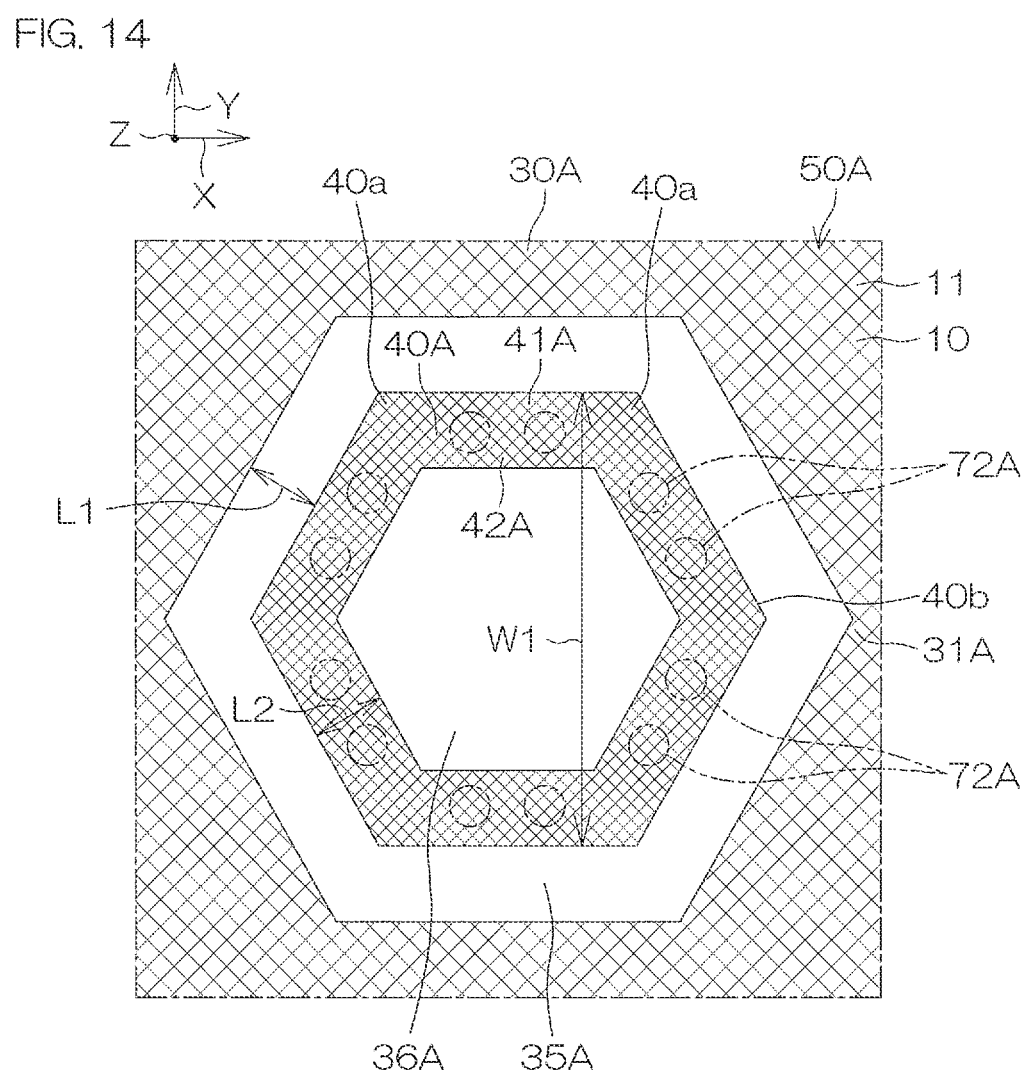
Figure 15:
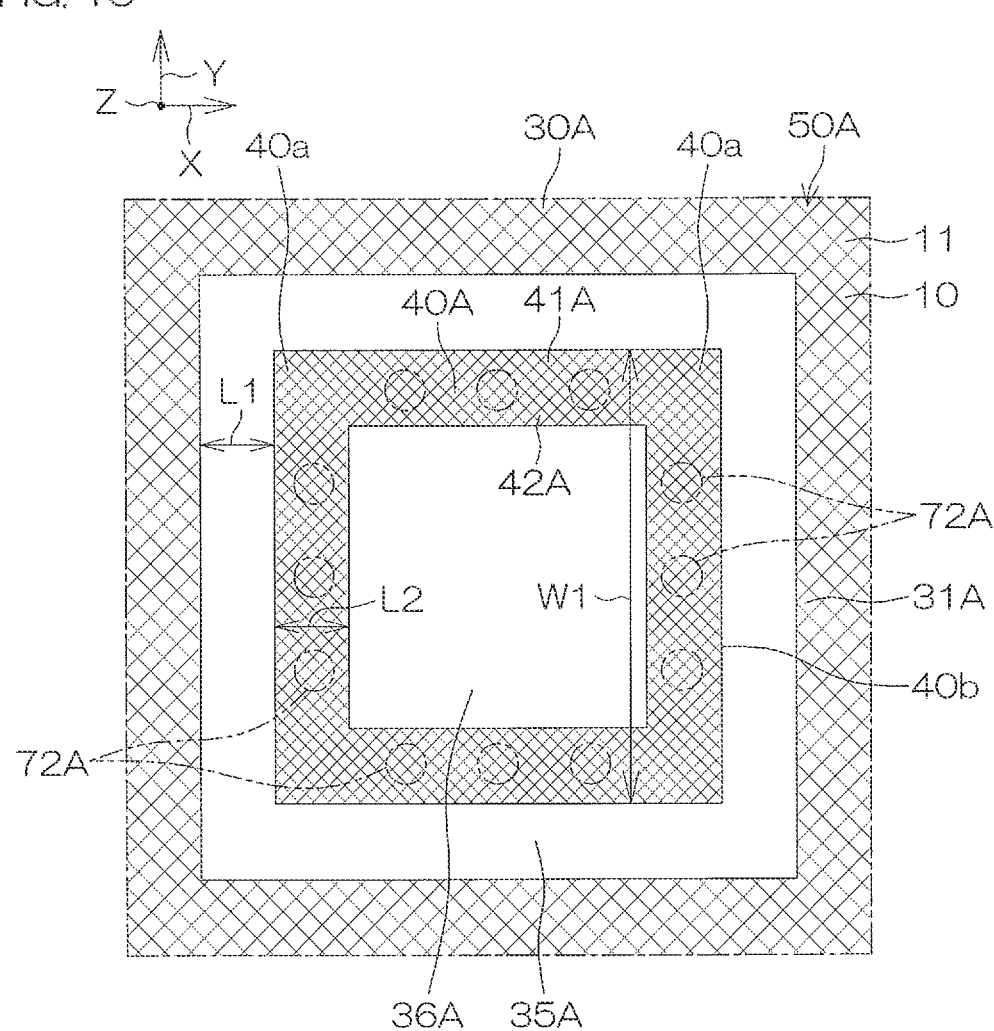
FIG. 15 is a plan view of a diode of a fourth modification.

FIG. 13 is a plan view of the first diode 50A of the second modification. FIG. 14 is a plan view of the first diode 50A of the third modification. FIG. 15 is a plan view of the first diode 50A of the fourth modification.

The first p-type impurity region 40A may be polygonal annular shape in a plan view as shown in FIG. 13 to FIG. 15. In detail, the first p-type impurity region 40A may be octagonal annular as shown in FIG. 13, or may be hexagonal annular as shown in FIG. 14, or may be quadrangular annular as shown in FIG. 15. The first p-type impurity region 40A may have a polygonal annular shape other than an octagonal annular shape, a hexagonal annular shape, and a quadrangular annular shape, and may have, for example, a triangular annular shape. In the first diode 50A of the second to fourth modifications, the first p-type impurity region 40A has an endless annular shape in a plan view surrounding the first inner insulating layer 36A.

There is a concern that the ESD current will concentrate on a corner portion 40a of the first p-type impurity region 40A if the first p-type impurity region 40A is polygonal annular shape in a plan view and if the second contact electrodes 72A formed at the first interlayer insulating film 60A contiguous to the first principal surface 11 are disposed on the corner portion 40a of the first p-type impurity region 40A. Therefore, in the first diode 50A of the second to fourth modifications, the second contact electrodes 72A are disposed along an external shape 40b of the first p-type impurity region 40A such that the second contact electrodes 72A avoid the corner portion 40a of the first p-type impurity region 40A in a plan view. This makes it possible to restrain the concentration of the ESD current in the corner portion 40a of the first p-type impurity region 40A.

In the first diode 50A of the second to fourth modifications, the width W1 of the first p-type impurity region 40A is a distance between a pair of sides that extend in parallel with each other in the external shape of the first p-type impurity region 40A.

Likewise, in the second diode 50B, the same modification can be applied (not shown). In detail, the second n-type impurity region 40B may be polygonal annular shape in a plan view.

The present invention can be embodied in still other modes.

For example, the first p-type impurity region 40A may have an ended shape even if the first p-type impurity region 40A is polygonal annular shape in a plan view like the first diode 50A of the second to fourth modifications. The same applies to each of the modifications of the second diode 50B. In other words, the second n-type impurity region 40B may have an ended shape even if the second n-type impurity region 40B is polygonal annular shape in a plan view.

The IC chip 1 according to the aforementioned preferred embodiment can be used in an IC that deals with a comparatively large electric current, such as a power IC or an IC (motor driver) that controllably drives a motor, and can be used in electric apparatuses that use this IC.

Additionally, the semiconductor device according to the present invention can be applied to various electric apparatuses, i.e., can be applied to mobile telecommunications products, such as a mobile phone and PHS (Personal Handyphone System), and pieces of information processing equipment typified by personal computers. The operation of these electric apparatuses is controlled by the IC chip 1 according to the aforementioned preferred embodiment.

Additionally, unlike the aforementioned preferred embodiment, the protection element 4 can be used as, for example, a protection element that protects MOSFET (Metal Oxide Semiconductor Field Effect Transistor) without being limited to a protection element that protects an internal circuit of an IC chip.

In the aforementioned preferred embodiment, each of the protection elements 4A and 4B is formed by the diodes 50A and 50B. However, each of the protection elements 4A and 4B may be formed by the single diode 50A or 50B.

Examples of features extracted from this description and from the drawings will be hereinafter shown. [A1] to [A14] mentioned below provide a semiconductor device whose barrier height has been reduced.

[A1] A semiconductor device including a semiconductor layer having a principal surface, a first-conductivity-type well region formed at a surface layer portion of the principal surface of the semiconductor layer, a first-conductivity-type first impurity region that is formed at a surface layer portion of the well region and that has an inner wall portion, and a second-conductivity-type annular second impurity region formed at the surface layer portion of the well region on a more inward side than the inner wall portion such that a pn junction portion is formed between the well region and the second impurity region.

With this arrangement, the well region and the second impurity region form a pn junction portion, and therefore electric charge is accumulated near an interface between the second impurity region and the well region. With the aforementioned arrangement, the second impurity region is annular. Therefore, it is possible to make the area of the interface between the second impurity region and the well region smaller when compared to an arrangement in which the shape of the second impurity region is, for example, circular, not annular, in a plan view unlike the aforementioned arrangement. Therefore, it is possible to reduce an electrostatic capacity.

Additionally, if the second impurity region is annular, it is possible to secure an ESD current capability equivalent to an arrangement in which the shape of the second impurity region in a plan view is a circular shape. Therefore, it is possible to restrain a decrease in ESD current capability. In other words, it is possible to restrain a decrease in ESD resistance properties.

As thus described, it is possible to restrain a decrease in ESD tolerance and to reduce the electrostatic capacity if the second impurity region is annular.

[A2] The semiconductor device according to A1, wherein the second impurity region has an outer wall that faces the inner wall portion, an inner wall that is contiguous to the well region, and a bottom wall that connects the outer wall and the inner wall together.

[A3] The semiconductor device according to A2, wherein the first impurity region has a bottom wall portion that is connected to the inner wall portion and that is contiguous to the well region, and the bottom wall portion of the first impurity region is placed on a side of the principal surface of the semiconductor layer with respect to the bottom wall of the second impurity region.

[A4] The semiconductor device according to A2 or A3, further including an intermediate insulating layer that is placed between the first impurity region and the second impurity region and that is contiguous to the outer wall.

[A5] The semiconductor device according to any one of A2 to A4, further including an inner insulating layer that is placed inside the second impurity region and that is contiguous to the inner wall.

[A6] The semiconductor device according to any one of A1 to A5, wherein a thickness of the second impurity region is smaller than a width of the second impurity region in a plan view.

[A7] The semiconductor device according to any one of A1 to A6, wherein the second impurity region is circular in a plan view.

[A8] The semiconductor device according to any one of A1 to A5, wherein the second impurity region is polygonal annular shape in a plan view.

[A9] The semiconductor device according to A8, further including an insulating film that is formed on the semiconductor layer and in which a plurality of via holes are formed, and a plurality of contact electrodes that are formed in the via holes, respectively, and that are connected to the second impurity region, wherein the contact electrodes are disposed along an external shape of the second impurity region such that the contact electrodes avoid a corner portion of the second impurity region in a plan view.

[A10] The semiconductor device according to any one of A1 to A9, wherein the first impurity region is endless in a plan view.

[A11] The semiconductor device according to any one of A1 to A10, further including a plurality of diodes formed by the well region, the first impurity region, and the second impurity region; and a region defining structure that defines an active region in which the diodes are formed.

[A12] The semiconductor device according to A11, wherein the first impurity region of the diodes is integrally formed.

[A13] The semiconductor device according to A11 or A12, further including an input-output wiring line into which or from which a signal is input or is output; a to-be-protected element that is connected to the input-output wiring line; and a protection element that is formed by the diode and that protects the to-be-protected element from an overvoltage applied to the input-output wiring line.

[A14] The semiconductor device according to A13, further including a first power wiring line to which a first power-supply voltage is applied; and a second power wiring line to which a second power-supply voltage lower than the first power-supply voltage is applied; wherein the protection element includes a first protection element in which the first impurity region is electrically connected to the first power wiring line and in which the second impurity region is electrically connected to the input-output wiring line, and a second protection element in which the first impurity region is electrically connected to the second power wiring line and in which the second impurity region is electrically connected to the input-output wiring line.

Although the preferred embodiments of the present invention have been described in detail, these preferred embodiments are merely specific examples used to clarify the technical contents of the present invention, and the present invention should not be interpreted as being limited to these specific examples, and the scope of the present invention shall be limited solely by the appended claims.

This application corresponds to Japanese Patent Application No. 2020-215445 filed with the Japan Patent Office on Dec. 24, 2020, the entire disclosure of which is incorporated herein by reference.

REFERENCE SIGNS LIST

1: IC chip (semiconductor device)
2: Input-output wiring line
3: Internal circuit (to-be-protected element)
4: Protection element
4A: First protection element
4B: Second protection element
5: First power wiring line
6: Second power wiring line
8A: First active region
8B: Second active region
10: Semiconductor layer
11: First principal surface
15: Region defining structure
30A: First n-type impurity region (First impurity region)
30B: Second p-type impurity region (First impurity region)
31A: First inner wall portion
31B: Second inner wall portion
32A: First bottom wall portion
32B: Second bottom wall portion
40A: First p-type impurity region (Second impurity region)
40B: Second n-type impurity region (Second impurity region)
41A: First outer wall
41B: Second outer wall
42A: First inner wall
42B: Second inner wall
43A: First bottom wall
43B: Second bottom wall
50A: First diode
50B: Second diode
60A: First interlayer insulating film
60B: Second interlayer insulating film
71A: Second via hole
71B: Fourth via hole
72A: Second contact electrode
72B: Fourth contact electrode
PJ1: Pn junction portion
PJ2: Pn junction portion
T2: Thickness
T4: Thickness

The invention claimed is:
1. A semiconductor device comprising:
a semiconductor layer having a principal surface;
a first-conductivity-type well region formed at a surface layer portion of the principal surface of the semiconductor layer;
a first-conductivity-type first impurity region that is formed at a surface layer portion of the first-conductivity-type well region and that has an inner wall portion;

a second-conductivity-type annular second impurity region formed at the surface layer portion of the first-conductivity-type well region on a more inward side than the inner wall portion such that a pn junction portion is formed between the first-conductivity-type well region and the second-conductivity-type annular second impurity region; and
an inner insulating layer that is placed inside the second-conductivity-type annular second impurity region and that is contiguous to the inner wall.

2. The semiconductor device according to claim 1, wherein the second-conductivity-type annular second impurity region has an outer wall that faces the inner wall portion, an inner wall that is contiguous to the first-conductivity-type well region, and a bottom wall that connects the outer wall and the inner wall together.

3. The semiconductor device according to claim 2, wherein the first impurity region has a bottom wall portion that is connected to the inner wall portion and that is contiguous to the first-conductivity-type well region, and
the bottom wall portion of the first impurity region is placed on a side of the principal surface of the semiconductor layer with respect to the bottom wall of the second-conductivity-type annular second impurity region.

4. The semiconductor device according to claim 2, further comprising an intermediate insulating layer that is placed between the first impurity region and the second-conductivity-type annular second impurity region and that is contiguous to the outer wall.

5. The semiconductor device according to claim 1, wherein a thickness of the second-conductivity-type annular second impurity region is smaller than a width of the second-conductivity-type annular second impurity region in a plan view.

6. The semiconductor device according to claim 1, wherein the second-conductivity-type annular second impurity region is circular shape in a plan view.

7. The semiconductor device according to claim 1, wherein the second-conductivity-type annular second impurity region is polygonal annular shape in a plan view.

8. The semiconductor device according to claim 7, further comprising:
an insulating film that is formed on the semiconductor layer and in which a plurality of via holes are formed; and
a plurality of contact electrodes that are formed in the via holes, respectively, and that are connected to the second-conductivity-type annular second impurity region;
wherein the contact electrodes are disposed along an external shape of the second-conductivity-type annular second impurity region such that the contact electrodes avoid a corner portion of the second-conductivity-type annular second impurity region in a plan view.

9. The semiconductor device according to claim 1, further comprising:
a plurality of diodes formed by the first-conductivity-type well region, the first impurity region, and the second-conductivity-type annular second impurity region; and
a region defining structure that defines an active region in which the diodes are formed.

10. The semiconductor device according to claim 9, wherein the first impurity region of the diodes is integrally formed.

11. The semiconductor device according to claim 9, further comprising:

an input-output wiring line into which or from which a signal is input or is output;

a to-be-protected element that is connected to the input-output wiring line; and a protection element that is formed by the diode and that protects the to-be-protected element from an overvoltage applied to the input-output wiring line.

12. The semiconductor device according to claim 11, further comprising:

a first power wiring line to which a first power-supply voltage is applied; and a second power wiring line to which a second power-supply voltage lower than the first power-supply voltage is applied;

wherein the protection element includes a first protection element in which the first impurity region is electrically connected to the first power wiring line and in which the second-conductivity-type annular second impurity region is electrically connected to the input-output wiring line, and a second protection element in which the first impurity region is electrically connected to the second power wiring line and in which the second-conductivity-type annular second impurity region is electrically connected to the input-output wiring line.

13. The semiconductor device according to claim 1, wherein the second-conductivity-type annular second impurity region is of an endless annular shape in a plan view.

* * * * *